United States Patent
Lee et al.

(10) Patent No.: US 12,421,258 B2
(45) Date of Patent: Sep. 23, 2025

(54) COMPOSITIONS INCLUDING METAL ORGANIC FRAME FOR INHIBITING FORMATION OR GROWTH OF ICE CRYSTALLIZATION AND PREPARING METHOD THEREOF

(71) Applicant: GWANGJU INSTITUTE OF SCIENCE AND TECHNOLOGY, Gwangju (KR)

(72) Inventors: Eunji Lee, Gwangju (KR); Nayeong Jeon, Gwangju (KR); Jiyeon Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 332 days.

(21) Appl. No.: 17/959,856

(22) Filed: Oct. 4, 2022

(65) Prior Publication Data
US 2023/0143886 A1    May 11, 2023

(30) Foreign Application Priority Data
Nov. 8, 2021  (KR) .................. 10-2021-0152398
Jun. 15, 2022  (KR) .................. 10-2022-0072799

(51) Int. Cl.
*C07F 7/00* (2006.01)
*C30B 28/06* (2006.01)
*C30B 29/16* (2006.01)

(52) U.S. Cl.
CPC ............... *C07F 7/00* (2013.01); *C30B 28/06* (2013.01); *C30B 29/16* (2013.01)

(58) Field of Classification Search
CPC . C07F 7/00; C07F 7/003; C30B 28/06; C30B 29/16
USPC ........................................................ 540/139
See application file for complete search history.

(56) References Cited

FOREIGN PATENT DOCUMENTS

| | | |
|---|---|---|
| FR | 2 921 661 A1 | 4/2009 |
| KR | 10-1439231 B1 | 9/2014 |
| KR | 10-2015-0031243 A | 3/2015 |
| KR | 10-2021-0010226 A | 1/2021 |

OTHER PUBLICATIONS

Wang et al., "A robust zirconium amino acid metal-organic framework for proton conduction", Nov. 22, 2018, Nature Communications, vol. 9, pp. 1-8, Supp. Info. (Year: 2018).*

Marshall, "Synthesis, Characterisation and Postsynthetic Modification of Zirconium and Hafnium Metal-Organic Frameworks", Mar. 2017, University of Glasgow, Doctoral Theses, pp. i-xiii, 1-265 (Year: 2017).*

(Continued)

*Primary Examiner* — Renee Claytor
*Assistant Examiner* — Y. Lynnette Kelly-O'Neill
(74) *Attorney, Agent, or Firm* — The PL Law Group, PLLC

(57) ABSTRACT

A composition according to an embodiment includes particles of metal-organic framework (MOF) including a central metal of zirconium, and two adjacent zirconiums on a surface of the particle has a structure represented by Formula 1. The composition may inhibit formation or growth of ice crystals through amino acid bond obtained by size control and surface modification of the metal-organic framework particles.

6 Claims, 23 Drawing Sheets

(56) References Cited

OTHER PUBLICATIONS

Li et al., "Facile One-Step Metal-Organic Framework Surface Polymerization Method", Jun. 18, 2021, Inorganic Chemistry, vol. 60, pp. 11750-11755 (Year: 2021).*
Zou et al., "Synthesis of β-Amino Acids via Catalyst- and Solvent-Free Aza-Michael Reaction", 2008, Chinese Journal of Chemistry, vol. 26, pp. 1309-1314 (Year: 2008).*
Zhu et al., "Metal-Organic Framework Nanoparticle-Assisted Cryopreservation of Red Blood Cells", Apr. 23, 2019, Journal of the American Chemical Society, vol. 141, pp. 7789-7796 (Year: 2019).*
Sun et al., "Metal-organic frameworks (MOFs) for biopreservation: From biomacromolecules, living organisms to biological devices", Sep. 30, 2020, Nano Today, vol. 35, pp. 1-27 (Year: 2020).*
Notice of Allowance issued on Feb. 27, 2024 from Korean Patent Office in a counterpart Korean Patent Application No. 10-2022-0072799 (all the cited references are listed in this IDS.) (English translation is also submitted herewith.).

* cited by examiner

FIG. 1A
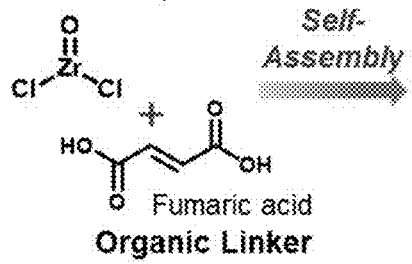
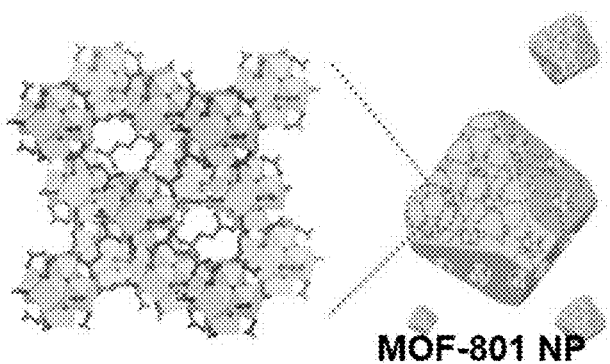
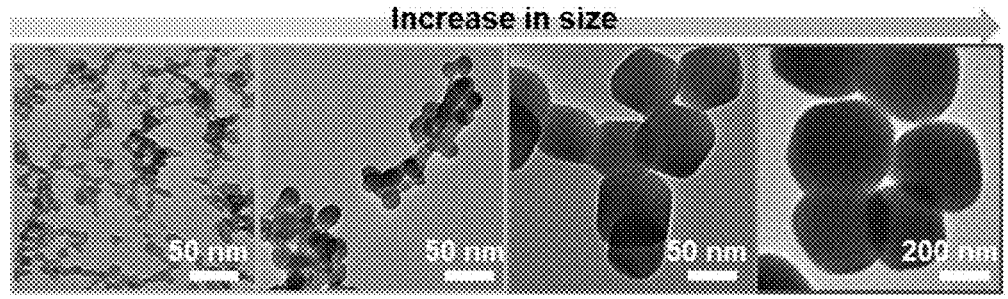
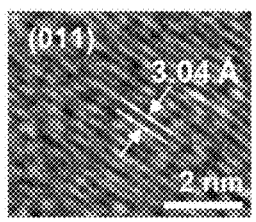
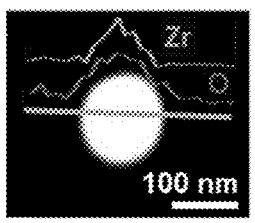
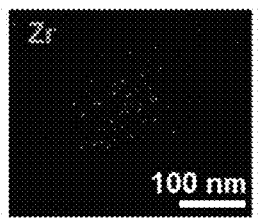
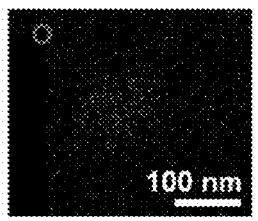

FIG. 5A
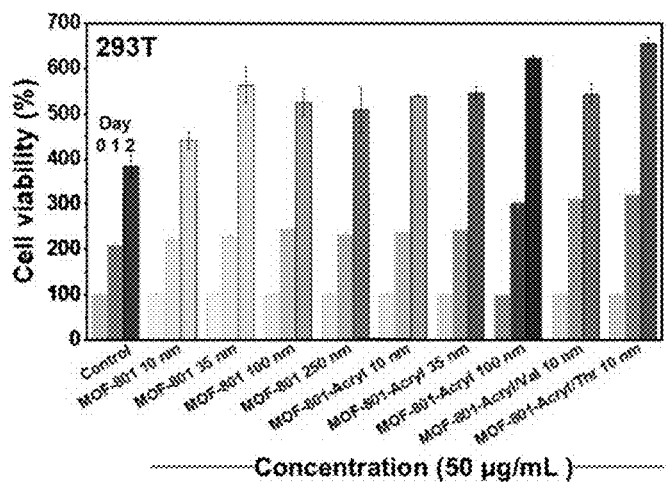
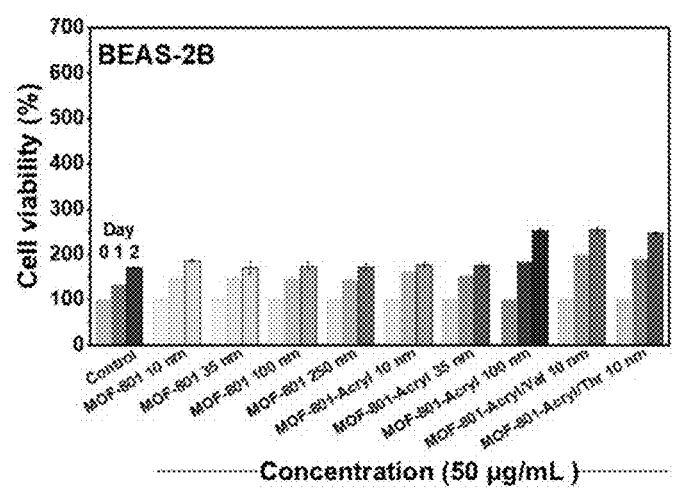
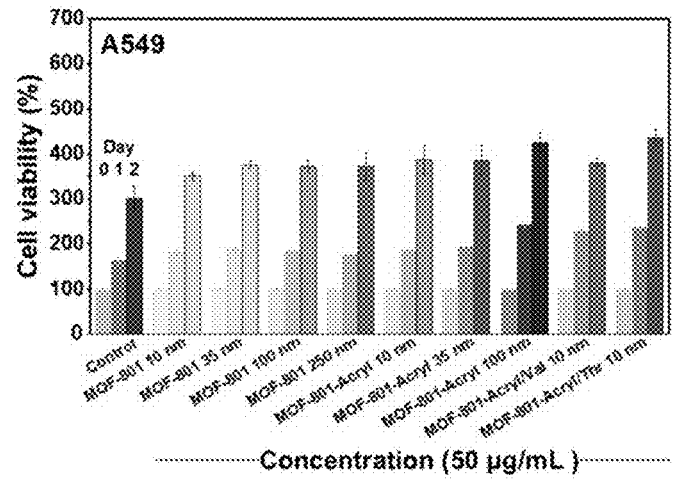

FIG. 10A
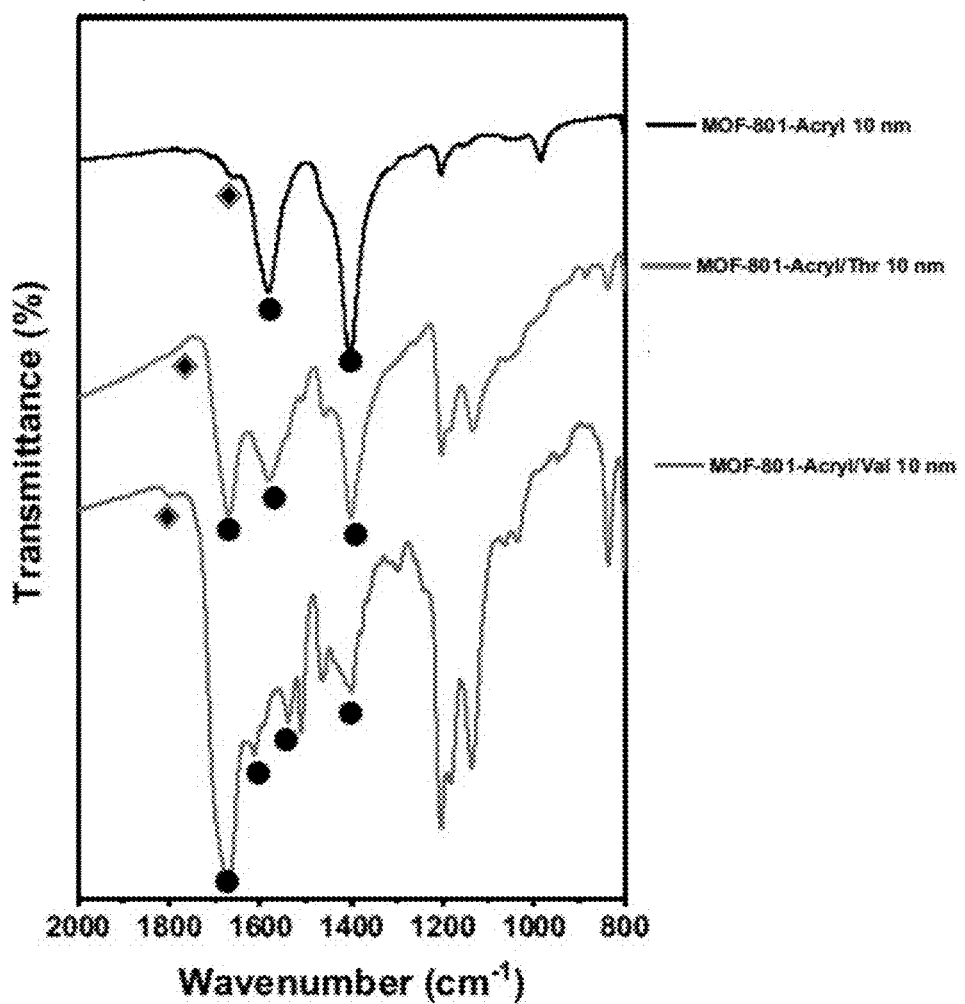
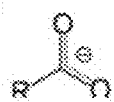 ● Carboxylate C=O stretch
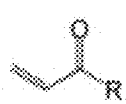 ◆ 2-CEA C=O stretch
Peak shift of C=O stretching band due to 2-CEA
→ Weakening of C=O stretching band
→ It was confirmed that each of amino acids is bound to α,β-unsaturated esters FIG. 10C
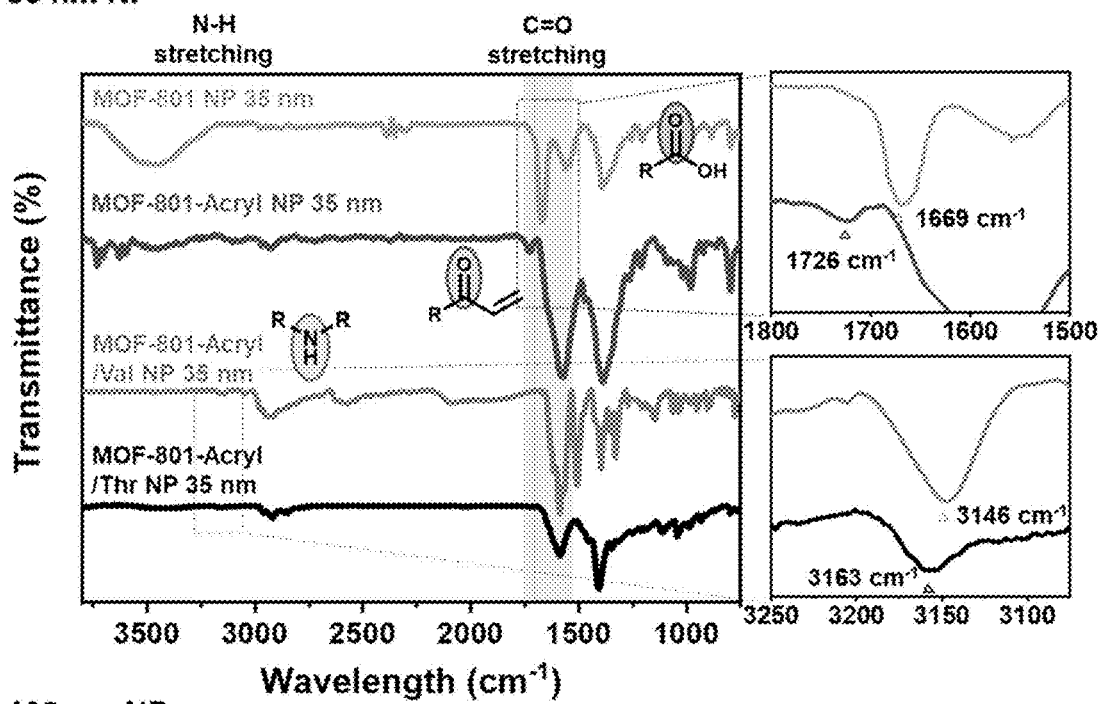
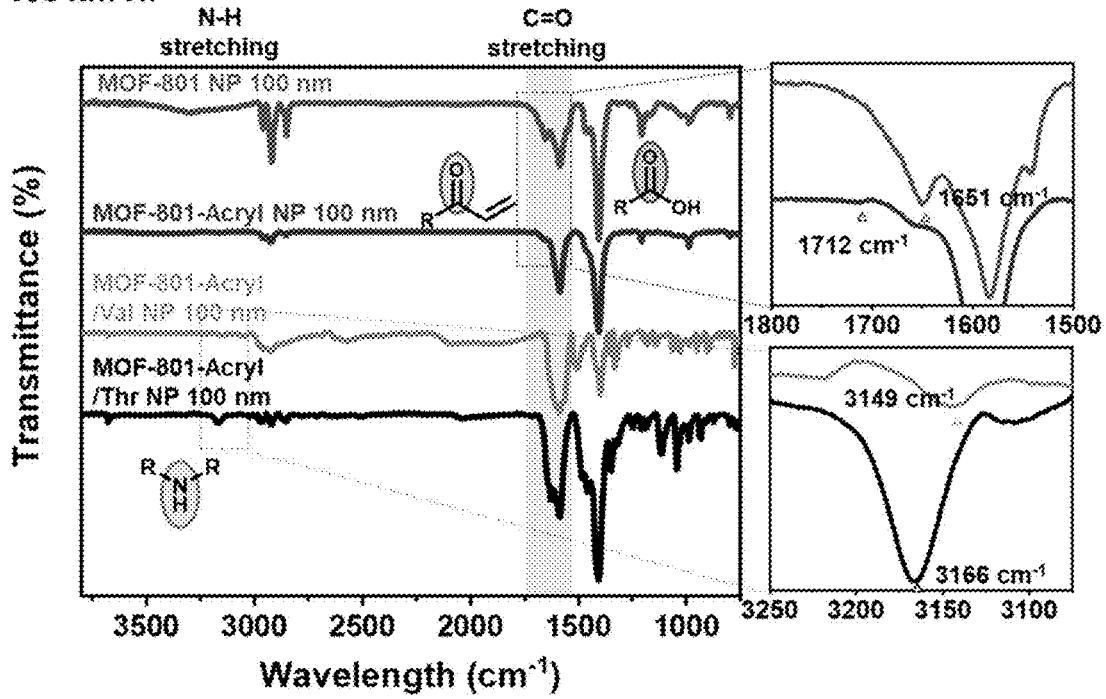

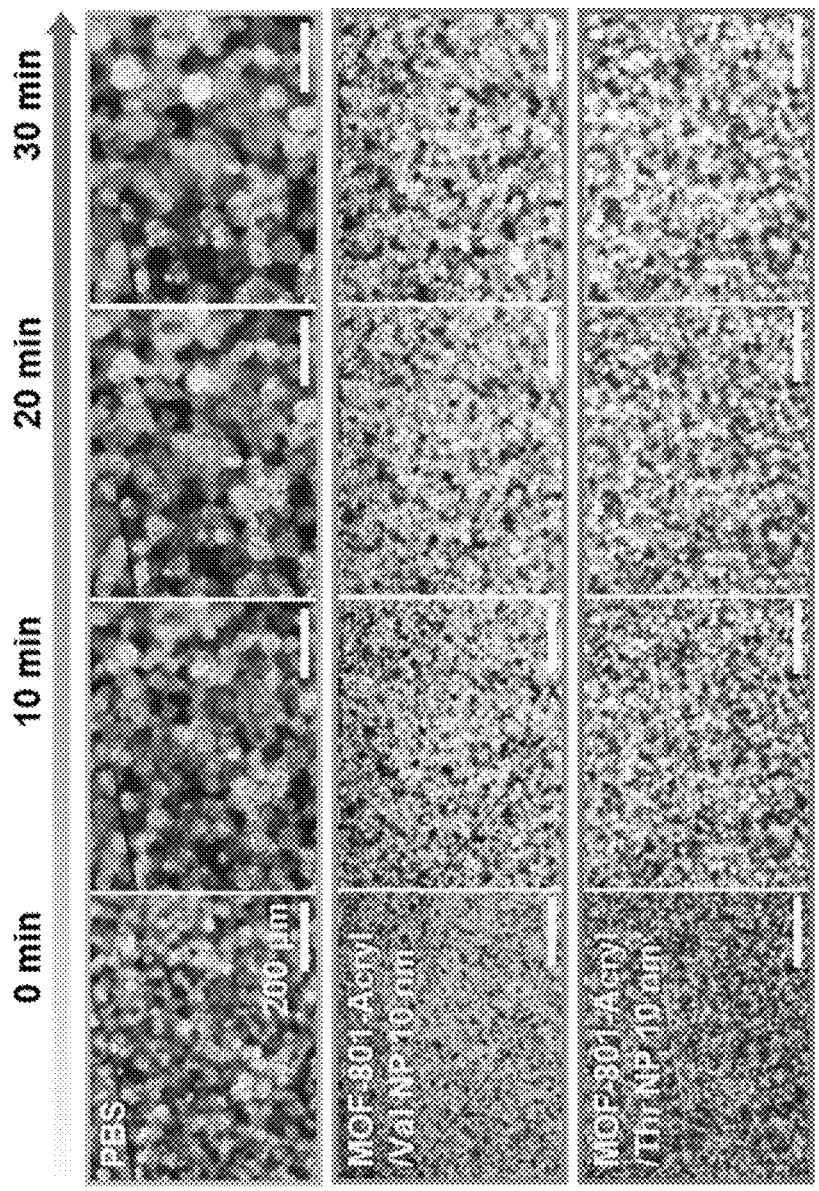

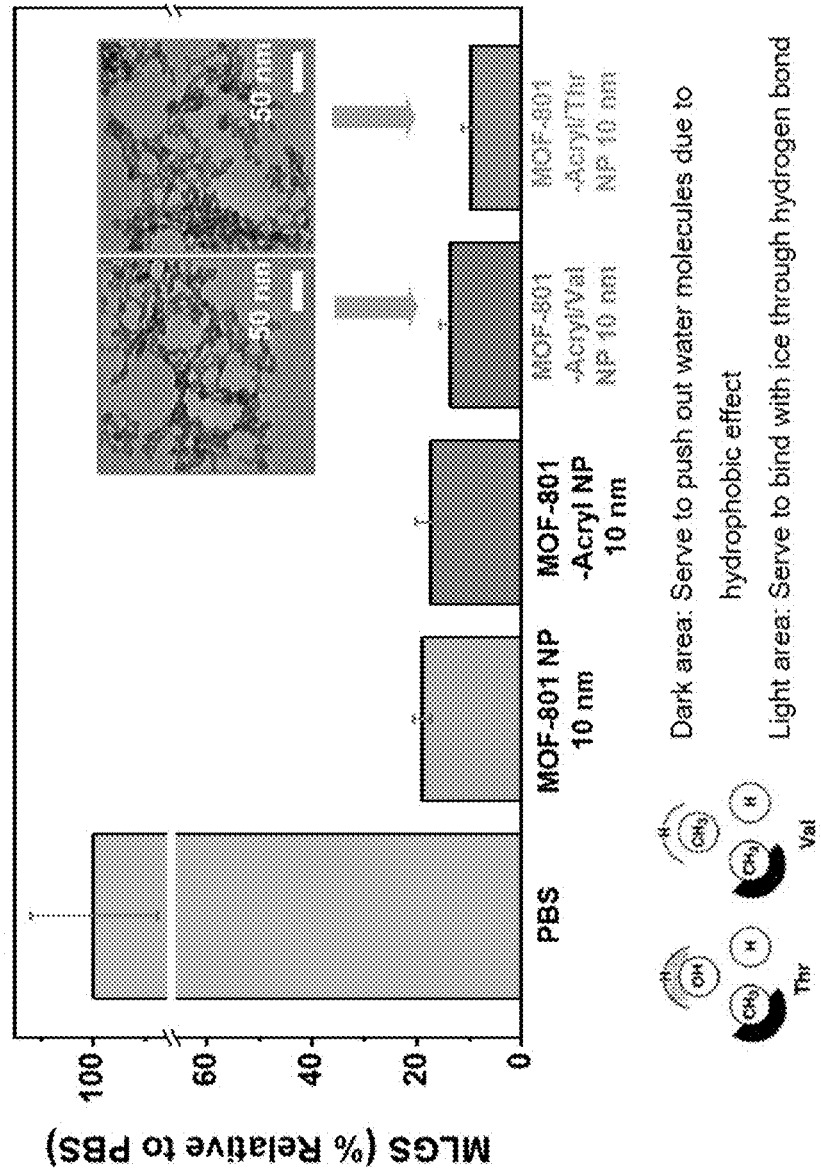

COMPOSITIONS INCLUDING METAL ORGANIC FRAME FOR INHIBITING FORMATION OR GROWTH OF ICE CRYSTALLIZATION AND PREPARING METHOD THEREOF

CROSS-REFERENCE TO RELATED APPLICATION AND CLAIM OF PRIORITY

This application claims the benefit under 35 USC § 119 of Korean Patent Application Nos. 10-2021-0152398, filed on Nov. 8, 2021, in the Korean Intellectual Property Office and 10-2022-0072799, filed on Jun. 15, 2022, in the Korean Intellectual Property Office, the entire disclosure of which is incorporated herein by reference for all purposes.

BACKGROUND

1. Field of the Invention

The present invention relates to a composition for inhibiting ice crystal formation or growth, which includes a metal-organic framework, and a preparation method thereof.

2. Description of the Related Art

As a method of preserving a material while preventing contamination caused by environmental factors, freezing is widely used in industries such as drugs and food, etc. However, when the material is exposed to a low temperature in the process of freezing, the material to be frozen is often damaged in terms of function. In particular, in the case of cells, it is difficult to secure the identity and viability in the process before and after thawing, such that a technique capable of freezing and preserving these cells in a state in which physiological functions thereof can be restored is required. Specifically, there is a high level of interest in cryogenic/frozen storage technique in relation to the storage and transport of COVID-19 vaccine in recent years.

Antifreeze proteins (AFPs) existing in nature, such as proteins isolated from fishes, plants, or insects, are effective in preventing ice formation, but currently available cryoprotective proteins are expensive in terms of production costs as well as have a low purity. Thereby, it is inefficient to use them in the industry. In addition, dimethyl sulfoxide (DMSO), which is a representative chemical cryoprotectant, has disadvantages in that it exhibits biotoxicity such as degeneration of brain or acting as a neurotoxin, and it is not easy to remove the same after use.

Therefore, there is an urgent need to develop a new antifreeze agent which may improve the above-described problems.

SUMMARY

It is an object of the present invention to provide a novel and effective composition for inhibiting ice crystal formation or growth.

Another object of the present invention is to provide a novel and effective composition for cell or tissue cryopreservation.

In addition, another object of the present invention is to provide a novel and effective composition for food cryopreservation.

Further, another object of the present invention is to provide a novel and effective method of preparing a composition for inhibiting ice crystal formation or growth.

1. A composition for inhibiting ice crystal formation or growth including metal-organic framework (MOF) particles having zirconium as a central metal,
wherein the zirconium on the particle surface includes a bond of a structure represented by Formula 1 below with adjacent zirconium:

[Formula 1]

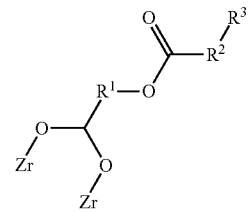

(wherein, Zr is zirconium on the particle surface, $R^1$ and $R^2$ are each alkyl having 1 to 5 carbon atoms, and $R^3$ is one selected from the group consisting of Thr, Val, Ala, Ser and Gly.

2. The composition for inhibiting ice crystal formation or growth according to the above 1, wherein the particle has a size of 35 nm or less.

3. The composition for inhibiting ice crystal formation or growth according to the above 1, wherein the metal-organic framework includes fumarate as an organic ligand.

4. A composition for cell or tissue cryopreservation including the composition of any one of the above 1 to 3.

5. A composition for food cryopreservation including the composition of any one of the above 1 to 3.

6. A method of preparing a composition for inhibiting ice crystal formation or growth, including:
a first step of surface-modifying metal-organic framework (MOF) particles having zirconium as a central metal with acrylate including a carboxyl group at a terminal thereof; and
a second step of treating the surface-modified metal-organic framework particles with amino acid selected from the group consisting of Thr, Val, Ala, Ser and Gly to bind the amino acid to the acrylate.

7. The method of preparing a composition for inhibiting ice crystal formation or growth according to the above 6, wherein the metal-organic framework includes fumarate as an organic ligand.

8. The method of preparing a composition for inhibiting ice crystal formation or growth according to the above 6, wherein before the first step, the method further includes the step of preparing the metal-organic framework particles in a size of 35 nm or less.

The present invention provides a composition for inhibiting ice crystal formation or growth, a composition for cell or tissue cryopreservation, or a composition for food cryopreservation, which may effectively inhibit ice recrystallization, be suitable for use in food, drugs, etc. due to low cytotoxicity, and be mass-produced with a low-cost process.

The present invention provides a method of preparing a composition for inhibiting ice crystal formation or growth, which may effectively inhibit ice recrystallization, be suitable for use in food, drugs, etc. due to low cytotoxicity, and be mass-produced with a low-cost process.

BRIEF DESCRIPTION OF THE DRAWINGS

The above and other objects, features and other advantages of the present invention will be more clearly understood from the following detailed description taken in conjunction with the accompanying drawings, in which:

FIGS. 1A to 1D schematically illustrate a structure of metal-organic framework (MOF), and shows transmission electron microscope (TEM) images corresponding thereto after the preparation of MOF particles in various sizes;

FIGS. 3A and 3B illustrate ice recrystallization inhibition (IRI) activity of MOFs by particle size, wherein FIG. 3A illustrates results of splat assay, and FIG. 3B illustrates IRI effect as a mean largest grain size (MLGS);

FIGS. 4A and 4B illustrate the IRI activity of MOF-acrylate by particle size, wherein FIG. 4A illustrates results of splat assay, and FIG. 4B illustrates the IRI effect as the mean largest grain size (MLGS);

FIGS. 5A and 5B illustrate the cell viability of MOFs in A549: lung carcinoma, 293T: kidney (embryo) cell, BEAS2B: non-tumorigenic lung epithelial cell according to particle size, surface modification (FIG. 5A) and concentration of MOF-801 10 nm (FIG. 5B).

FIGS. 7A and 7B illustrate cryopreservation effect confirmed on 293T: embryonic kidney cells, and DMSO was used as a control, wherein FIG. 7A illustrates TEM images, and FIG. 7B illustrates relative cell cryopreservation effect of MOF and MOF-Acrylate on DMSO by particle size;

FIGS. 10A to 10C illustrate results of FT-IR analysis for amino acid bond to MOF-Acryl;

FIGS. 12A and 12B illustrates the IRI effect in which amino acid is bound to amino acid-linked MOF-Acryl, wherein FIG. 12A illustrates results of splat assay, and FIG. 12B illustrates the IRI effect as the mean largest grain size (MLGS)

DETAILED DESCRIPTION

Figure 1B:
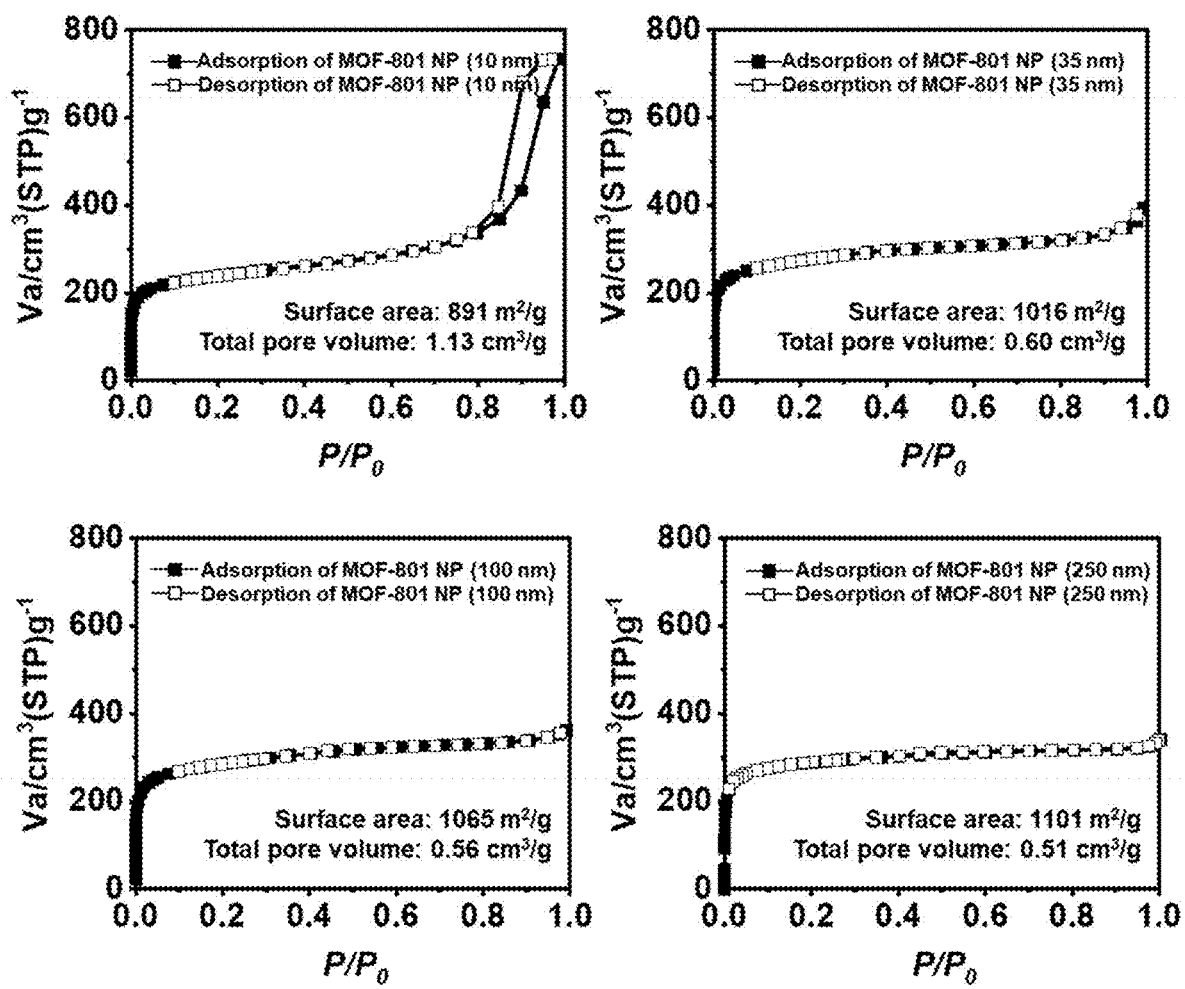

Hereinafter, the present invention will be described.

The present invention relates to a composition for inhibiting ice crystal formation or growth, which includes metal-organic framework (MOF) particles having zirconium as a central metal, wherein the zirconium on the particle surface includes a bond of a structure represented by Formula 1 below with adjacent zirconium:

[Formula 1]

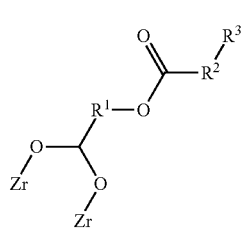

(wherein, Zr is zirconium on the particle surface, $R^1$ and $R^2$ are each alkyl having 1 to 5 carbon atoms, and $R^3$ is one selected from the group consisting of Thr, Val, Ala, Ser and Gly).

The metal-organic framework (MOF) refers to a regular crystalline material in which metals are connected by an organic material to form a network. Specifically, the MOF may be comprised of secondary building units (SBUs) including a central metal ion (or metal cluster) and a linker which is an organic ligand for connecting them. Geometry of the MOF depends on physical properties of the SBU, and the porosity changes according to a length of the linker.

The composition of the present invention includes a zirconium-based MOF in which zirconium is used as a central metal. Zirconium is a metal having low cytotoxicity, and MOF based on the zirconium is suitable for use in drugs, food and the like. The zirconium-based MOF includes MOF 801, MOF-802, UiO-66, MOF-808, MOF-841, DUT-67, PIZOF-2, MOF-804, MOF-805 and MOF-806, but it is not limited thereto. The SBU may include, for example, $Zr_6O_4(OH)_4(—CO_2)_{12}$, $Zr_6O_4(OH)_4(—CO_2)_{10}$, $Zr_6O_4(OH)_4(—CO_2)_9$ or $Zr_6O_4(OH)_4(—CO_2)_6$, but it is not limited thereto.

The organic ligand is also referred to as a linker, and any organic compound having a functional group capable of coordinating may be used. For example, a compound having at least one functional group selected from the group consisting of a carboxyl group (—COOH), a carboxylate anion group (—COO—), an amine group (—NH2) and an imino group (=NH), a nitro group (—NO2), a hydroxyl group (—OH), a halogen group (—X) and a sulfonic acid group (—SO3H), a sulfonic acid anion group (—SO3-), a methanedithioic acid group (—CS2H), a methanedithioic acid anion group (—CS2-), a pyridine group and a pyrazine group or a mixture thereof may be used by binding with the central metal, but it is not limited thereto. For example, the organic ligand may include fumarate, succinate, glutarate, muconate, adipate, 2,5-thiophenedicarboxylate, terephthalate, 2,5-pyrazine dicarboxylate, naphthalene-2, 6-dicarboxylate, biphenyl-4,4'-dicarboxylate, azobenzenedicarboxylate, dichloroazobenzenedicarboxylate, azobenzenetetracarboxylate, dihydroxyazobenzenedicarboxylate, benzene-1,2,4-tricarboxylate, benzene-1,3,5-tricarboxylate, benzene 1,3,5-tribenzoate, 1,3,5-tris[4'-carboxy (1,1'-biphenyl-4-yl)]benzene, benzene-1,2,4,5-tetracarboxylate, naphthalene-2,3,6,7-tetracarboxylate, naphthalene-1,4, 5,8-tetracarboxylate, biphenyl-3,5,3',5'-tetracarboxylate, 2-aminoterephthalate, 2-nitroterephthalate, 2-methylterephthalate, 2-chloro terephthalate, 2-bromoterephthalate, 2,5-dihydroxoterephthalate, tetrafluoroterephthalate, 2,5-dicarboxyterephthalate, dimethyl-4,4'-biphenyldicarboxylate, tetramethyl-4,4'-biphenyldicarboxylate, or dicarboxy-4,4'-biphenyldicarboxylate, but it is not limited thereto.

Ice crystals can grow through ice recrystallization, which refers to a process of growing from small ice crystals to larger ice crystals, and the growth thereof occurs according to an Ostwald ripening mechanism. Ostwald ripening may be performed in a dissolution-diffusion-refreezing or a sublimation-diffusion-condensation mechanism. That is, the growth of ice crystals does not occur as the ice crystals are adhered to each other, but rather as small ice crystals are melted between the crystals, and spread toward large ice crystals, thus to be a part of large ice crystals while refreezing.

The particle size may be, for example, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less, and preferably 35 nm or less, or 10 nm or less.

The MOF provides hydrogen donors to the surface of ice crystals at a regular interval due to the lattice structure to match the ice crystal lattice, thereby suppressing formation or growth of the ice crystals. The smaller size of the MOF particles as in the embodiment of the present invention, for example, at the particle size of 100 nm or less, 35 nm or less, or 10 nm or less, the higher the exhibited effect.

The composition of the present invention includes a compound in which the surface of the MOF particles is modified, and specifically, and may have a configuration in which an amino acid known to be bound to ice crystals, for example, Thr, Val, Ala, Ser, or Gly is bound to the MOF particles. Through the above-described modification, solubility and stability in water may be improved, and an additional antifreezing effect may be obtained.

Introducing an amino acid of a biomolecule, that is, the introduction of the amino acid has an advantage in that biocompatibility thereof is increased. In addition, direct hydrogen bond with water molecules may be induced by additionally introducing amino acids, and ice crystal growth may be inhibited by inducing a hydrophobic effect to push out water molecules. By using a characteristic that the MOF has a constant lattice, when introducing amino acids therein, functional groups that can act directly with water molecules may be arranged at a constant lattice interval.

That is, since the composition of the present invention has an excellent effect of inhibiting ice recrystallization as well as is biocompatible, it may be used as a cryoprotectant for cells or tissues, for example, for cryopreservation in food or drug fields. In addition, the compound included in the composition of the present invention has advantages in that it is easy to produce compared to AFP which is a natural protein, and it is easy to provide structural and functional changes compared to a polymeric cryoprotectant.

The composition of the present invention may further include a material having an antifreezing ability known in the prior art. For example, the antifreeze composition may include dimethyl sulfoxide (DMSO), glycerol, 1,2-propanediol, sucrose, glucose, proline, galactose, lactose, glycine betaine, or fructose. In addition, when using the antifreeze composition for cell cryopreservation or food cryopreservation, it may include sucrose, glucose, lactose, glycine betaine, or fructose, which has low cytotoxicity.

In addition, the present invention relates to a composition for cell or tissue cryopreservation including any one of the above-described compositions for inhibiting ice crystal formation or growth.

Cryopreservation is a method of storing an object to be preserved in a cryogenic (ultra-low temperature) state through a process of freezing the same, and then thawing it when necessary. Upon cryopreservation, all biological activities including biochemical reactions that lead to cell death are effectively halted.

When cryopreserving cells or tissues, ice recrystallization may occur in the process of thawing the frozen cells or tissues at the time of trying to use them later. When ice recrystallization occurs, as the ice crystals grow, the cell membrane is damaged and cell dehydration occurs, thereby resulting in damaging the cells and tissues. That is, organisms living in a lower-temperature environment may be more easily damaged by the ice recrystallization.

The composition for cell or tissue cryopreservation of the present invention may inhibit ice growth or recrystallization, thereby preventing cells or tissues from dying due to ice crystal growth.

The composition for cell or tissue cryopreservation of the present invention may be applicable to all cells or tissues that are commonly used by freezing for preservation. Cells to be applied may include, for example, prokaryotic cells; eukaryotic cells; microorganisms; animal cells; cancer cells, sperms; eggs; stem cells including adult stem cells, embryonic stem cells, and dedifferentiated stem cells; blood cells including cord blood, white blood cells, red blood cells, and platelets; and tissue cells including kidney cells, liver cells, and muscle cells, but they are not limited thereto. Tissues to be applied may include, for example all tissues such as cornea, kidney, heart, small intestine, pancreas, lung, liver, and the like, but they are not limited thereto.

The composition for cell or tissue cryopreservation of the present invention may include, for example, a cryopreservation liquid for cryopreservation of cells and tissues in addition to the above-described composition for inhibiting the formation or recrystallization of ice crystals. The cryopreservation liquid may include water, saline, phosphate buffered saline (PBS), various cell culture liquids, and the like, but it is not limited thereto.

In addition, the present invention relates to a composition for food cryopreservation including any one of the above-described compositions.

Cryopreservation may be defined within the above-described range, but it is not limited thereto.

When cryopreserving food, ice recrystallization may occur in the process of thawing the frozen food at the time of trying to use it later. When ice recrystallization occurs, ice crystals generated from moisture grow, which destroys cells or tissues present in food, thereby resulting in degradation of taste.

The composition for food cryopreservation of the present invention may inhibit ice growth or recrystallization, thereby preventing a change in the osmotic pressure due to ice crystal growth or death of cells or tissues in food, and thereby minimizing quality degradation of food.

The composition for food preservation of the present invention may be applicable to all foods that are commonly used by freezing for preservation. Food to be applied may include meats, fishes and shellfishes, fruits and vegetables, but it is not limited thereto.

In addition, the present invention relates to a method of preparing a composition for inhibiting ice recrystallization including: a first step of surface-modifying metal-organic framework (MOF) particles having zirconium as a central metal with acrylate including a carboxyl group at a terminal thereof; and a second step of treating the surface-modified metal-organic framework particles with amino acid selected from the group consisting of Thr, Val, Ala, Ser and Gly to bind the amino acid to the acrylate.

The metal-organic framework having zirconium as the central metal is the same as described above, and the MOF may include, for example, fumarate as an organic ligand.

The acrylate including a carboxyl group at the terminal is intended to mediate the binding of the MOF with amino acid, and the first step may be, for example, replacing the organic ligand on the surface of the MOF with the acrylate by ligand exchange.

The second step may be performed through an Aza-Michael addition reaction of MOF-Acryl with amino acid molecules under a solvent or non-solvent condition. The solvent is not particularly limited as long as it is a solvent that allows MOF and amino acid to be easily dissolved, such as EtOH, DMF, or THF, etc. Specifically, the unsaturated binding portion at the terminal of the acrylate is bound with —$NH_2$ of the amino acid.

The acrylate is not particularly limited as long as it is acrylate including a carboxyl group at the terminal, and preferably, 2-carboxyethyl acrylate. When using acrylate having a simple structure, such as 2-carboxyethyl acrylate, the amino acid is introduced in close proximity to the surface of MOF particles, such that the effect on control of the MOF particle size and the effect of amino acid introduction can be achieved at the same time, and there is an advantage in that the adjacent molecules do not cover the functional group of the amino acid well.

The surface modification refers to, for example, modifying the surface of the MOF such as attaching the functional group to the surface of the MOF through the above-described chemical reaction.

The preparation method may include, before the first step, for example, the step of preparing metal-organic framework particles in a size of 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, 5 nm or less, and preferably 35 nm or less, or 10 nm or less. As described above, when the MOF has a small particle size, an excellent effect of inhibiting ice crystal formation or growth appears.

Hereinafter, the present invention will be described in detail with reference to examples.

Example

1. Preparation and Modification of MOF Particles
1-1. Preparation of Size Controlled MOF Particles In order to confirm the antifreezing effect of the MOF according to the particle size, MOF particles having sizes controlled to about 10 nm, 35 nm, 100 nm, and 250 nm were prepared. Fumaric acid (1.16 g) (Sigma Aldrich, Germany) and $ZrOCl_2 \cdot 8H_2O$ (3.2 g) (Sigma Aldrich, Germany) were dissolved in 40 mL mixed solvent of DMF/formic acid, and heated to 130° C. for 6 hours to obtain a white precipitate. The synthesized MOF-801 was washed three times with 20 mL of clean DMF and 20 mL of methanol, respectively. Then, the solid was dried at 100° C. for 24 hours to obtain a sample.

FIG. 1A schematically illustrates MOF-801 NP structure, and images of MOF particles prepared in various sizes. Through results of high-resolution TEM (HRTEM) measurement, it was confirmed that the lattice pattern of MOF-801 NP is 3.04 Å which represents (011) plane of $ZrO_2$. Scanning TEM (STEM) elemental analysis through energy dispersive spectroscopy (EDS) mapping shows that there are Zr and O in $ZrO_2$ and fumarate.

From the analysis results of $N_2$ adsorption-desorption isotherms (FIG. 1B), the permanent porosity of MOF-801 can be confirmed, and in particular, the nanoporous of 10 nm NP is very high.

Figure 1C:
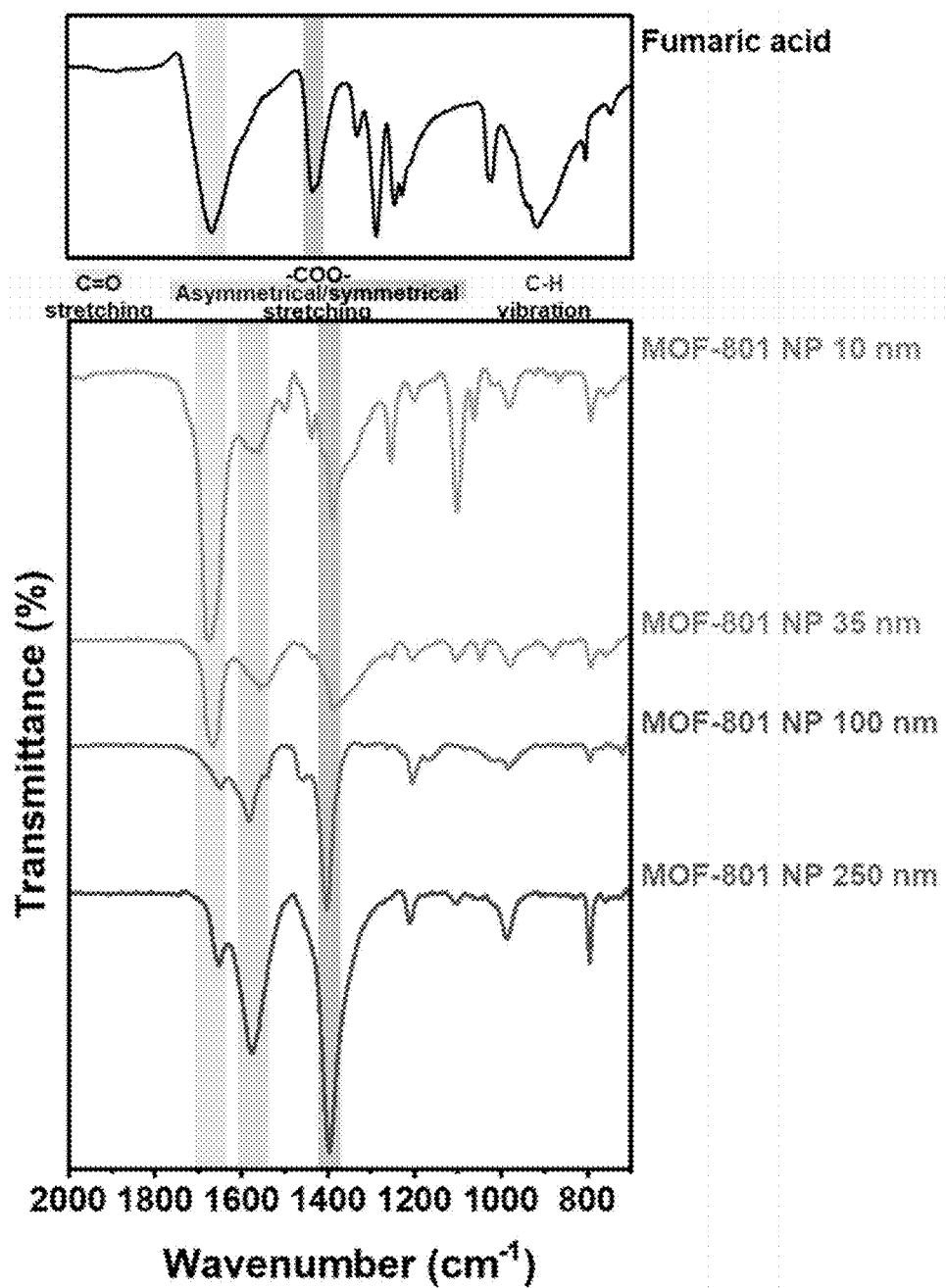

Referring to the FT-IR spectra results of FIG. 1C, it can be confirmed that an asymmetric stretching vibration peak located at 1575 $cm^{-1}$ in —COO— appeared together with the shift of a symmetric stretching vibration peak at 1400 $cm^{-1}$ derived from fumaric acid to form MOF-801 NP.

Figure 1D:
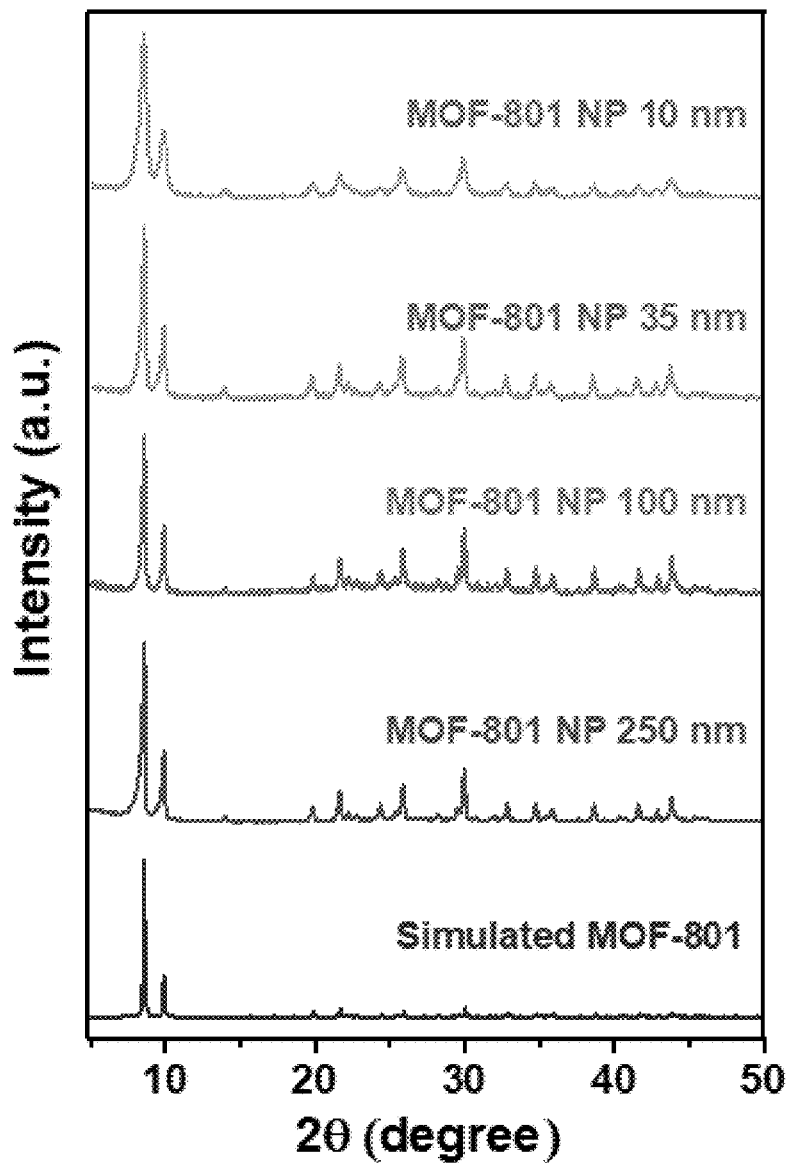
Figure 2:
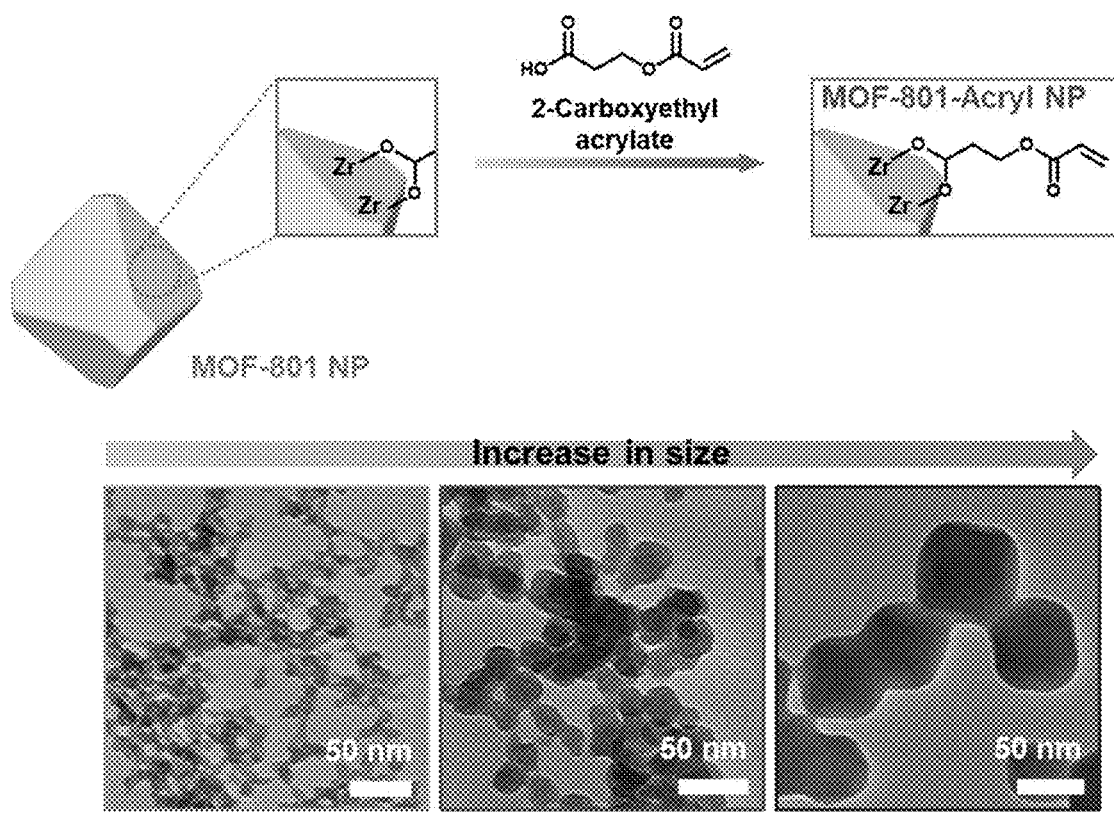
FIG. 2 illustrates TEM images in which the surface of MOF particles is modified with an acrylate functional group.
Figure 3A:
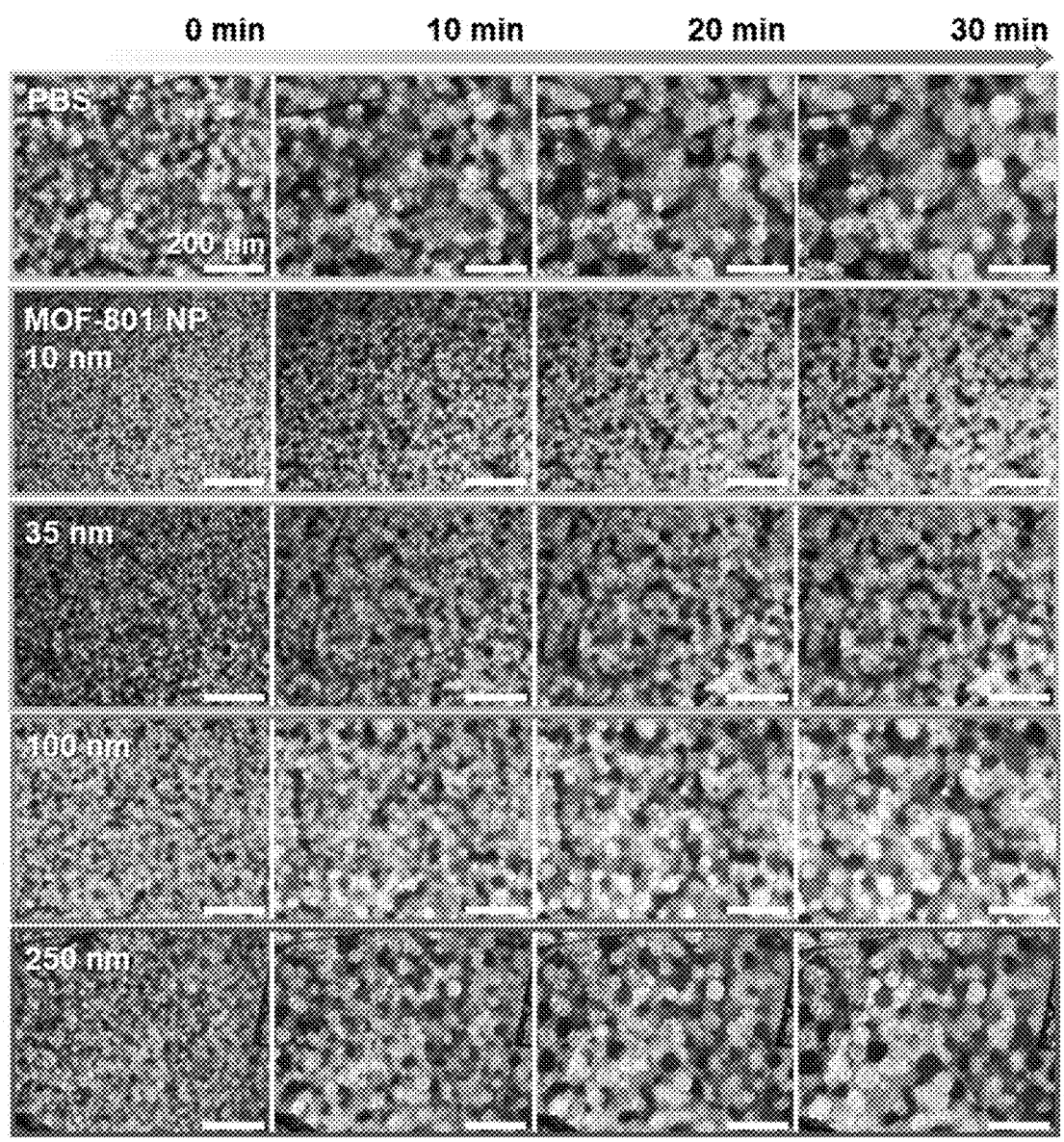
Figure 3B:
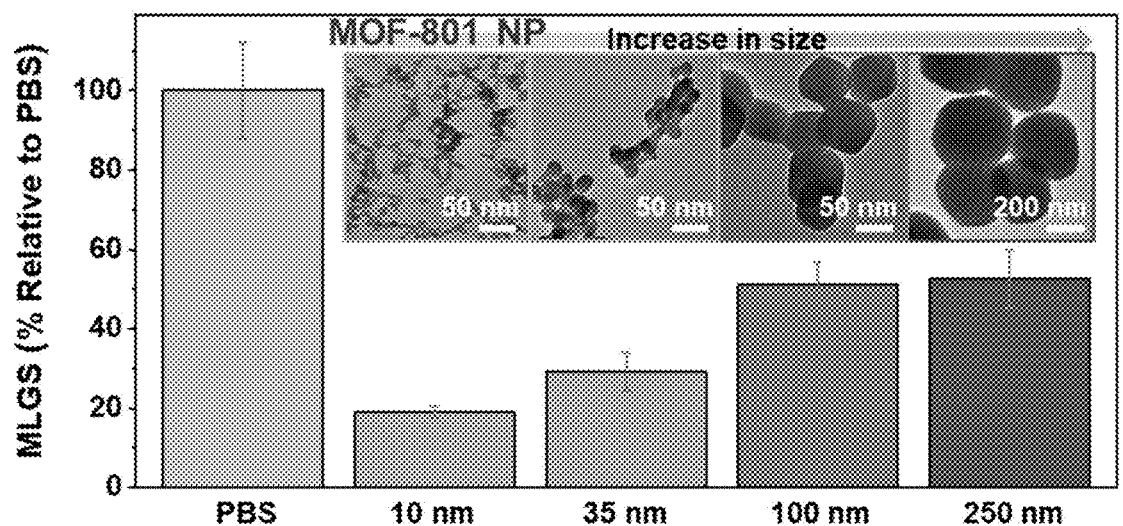
Figure 4A:
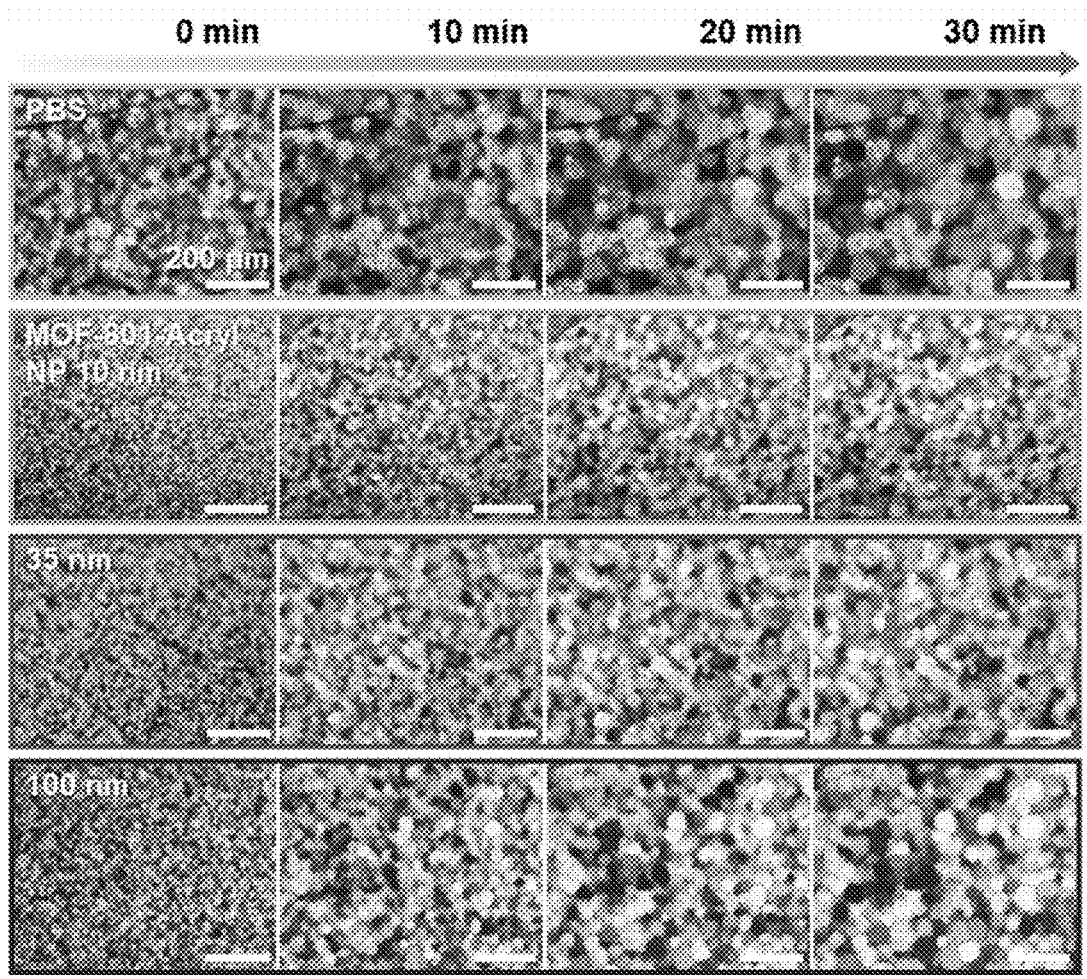
Figure 4B:
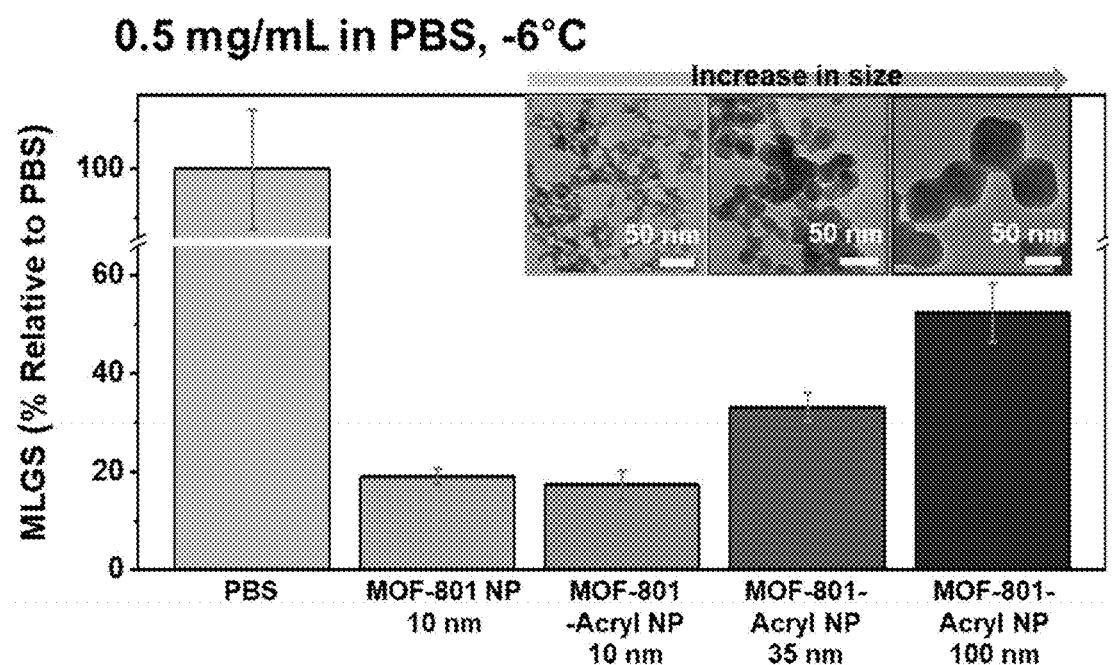

Powder X-ray diffraction analysis (PXRD) was performed on the prepared MOF-801 NPs for each size (FIG. 1D), and the diffraction pattern was consistent with the simulated crystallographic data and standard values. Lattice parameters were calculated in a range of 17.88±0.05 Å for each MOF-801 NP, which are very close to the known lattice parameter of 17.91 Å for the bulk material. In addition, peak broadening was observed as the size of the MOF-801 NPs is decreased, which means that interlayer ordering constraints were given as the curvature of the NPs is increased.

1-2. Surface Modification Using Acrylates of MOF Particles

In order to introduce ice-binding moieties to the prepared MOF particles, the MOF particles were surface-modified using 2-carboxyethyl acrylate.

Specifically, linker fumaric acid bound to the surface of the MOF particles may be replaced with 2-carboxyethyl acrylate using a ligand exchange method in MOF-801, and appropriate catalyst treatment could be performed thereon by those skilled in the art. Ethanol was used as an experimental solvent, which is easy to mass-produce the surface-modified MOFs in a simple experimental method.

Acrylate-functionalization was performed in the ethanol solvent. After dissolving MOF-801 and 2-carboxyethyl acrylate together in the ethanol solvent, hydrofluoric acid, which is able to reduce an activation energy when ligand exchange occurs, was used as a catalyst. The reaction was performed for 24 hours, and the synthesized MOF-801-Acryl was washed with methanol, ethanol, and DMF in this order, and then dried to obtain a sample.

2. Ice Recrystallization Inhibition (IRI) Effect of MOF Particles

Ice recrystallization inhibition (IRI) activity was analyzed to confirm an effect of inhibiting ice crystal growth of the prepared MOF particles. The effect of IRI was confirmed through a commonly known splat assay.

IRI activity was determined based on "Charles A. Knight, John Hallett, A. L. DeVries (1988). Solute effects on ice recrystallization: An assessment technique. Cryobiology, 25(1).

10 μL of sample at a concentration of 0.5 mg/ml was dropped onto a pre-chilled (−150° C.) cover slip surface from a height of 1.0 m to form a thin ice film. The glass cover slip having the thin ice film formed thereon was transferred to a nanoliter osmometer (Otago Osmometers, Dunedin, New Zealand) at −20° C. Thereafter, the temperature of the glass cover slip was gradually increased at to −6° C., and the sample was observed for 30 minutes. In order to observe the ice crystals, polarized optical microscope images were obtained with a polarization optical microscope in which a polarizing plate was mounted on the normal optical microscope. The polarized optical microscope images were taken using a Polarizing Microscope ECLIPSE LV100POL (Nikon, Tokyo, Japan). Thirty (30) largest domains in the field of view were selected and a mean value was calculated to assess the IRI activity. The values of each individual experiment were averaged by mean largest grain size (MLGS) analysis.

As a result of the experiment, the zirconium-based MOF had high solubility in water and excellent stability, such that the IRI effect was confirmed in all sample groups. In particular, it was confirmed that the smaller the particle size, the better the IRI effect.

Further, it was confirmed that there was no significant difference in the IRI effect compared to the MOF before modification, even when the surface was modified with acrylate (MOF-Acrylate) for the subsequent amino acid bond.

3. Cytotoxicity of MOF Particles

In order to determine suitability when using the composition of the present invention as a cryoprotectant for cells or tissues, a cell viability test was performed on the prepared MOF-801 NP in human embryonic kidney (293T), non-neoplastic lung bronchial epithelium (BEAS-2B) and lung carcinoma epithelial (A549) cell lines using CellTiter-Glo®.

Figure 5B:
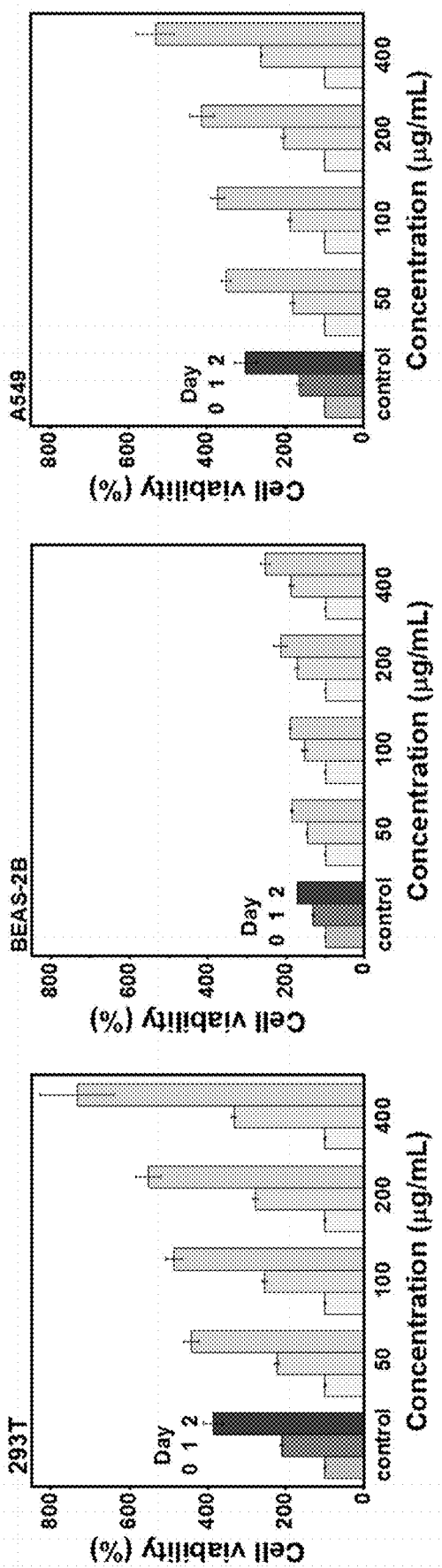

No noticeable toxicity was observed even after 2 days of incubation after MOF NP treatment. Cell viability was further improved with increasing incubation time, suggesting the ability of MOF-801 NPs to be utilized as cryopreservation nanoformulations for both normal cells and cancer cells (FIG. 5A).

In addition, as a result of examining the cell viability according to the concentration of MOF-801 10 nm NP (FIG. 5B), the cell viability tends to improve as the concentration increases, indicating that MOF-801 NP is not toxic in the cellular environment.

A549, 293T, and BEAS2B cells were cultured at a concentration of $1\times10^6$ cells/ml in a culture medium containing 1 μg/ml of actinomycin C1 at 37° C. and 5-6.5% $CO_2$ for 3 hours, respectively. Cell culture of seed cells at a concentration of $5\times10^4$ cells/well was performed on a microplate (tissue culture grade, 96 wells, flat bottom) at 37° C. and 5-6.5% $CO_2$ for 24 hours in a 100 μl of culture medium containing 1 μg/ml of actinomycin C1 and hTNF-α at a concentration of 0.001-0.5 ng/ml. After the culture period, 10 μl of MTT labeling reagent (final concentration 0.5 mg/ml) was added to each well, and culture was further performed on the microplate for 4 hours. After adding 100 μl of solubilization solution to each well, the microplate was left in an incubator overnight. Then, the present inventors identified whether purple formazan crystals were completely solubilized, and an absorbance of the sample was measured using a microplate (ELISA) reader. MTT (3-[4,5-dimethyl-thiazol-2-yl]-2,5-diphenyltetrazolium bromide) (1×), at 5 mg/ml in phosphate buffered saline (PBS), and the solubilization solution used in the above experiment were purchased from Merck, Germany.

4. Cell Cryopreservation Effect of MOF Particles

In order to confirm the effect when using the composition of the present invention as a cell cryoprotectant, the cell cryopreservation effect was confirmed for 293T: embryonic kidney cells.

293T cells were cultured on 60 mm cell culture dish coated with 0.1% gelatin (Sigma Aldrich, Germany) in a DMEM (Hyclone) medium containing 2 mM L-glutamine (Mediatech Inc.), 1% of penicillin/streptomycin (Mediatech Inc.), 15% of heat-inactivated fetal bovine serum (Hyclone), 20 mM HEPES-pH 7.3 (Cellgro), 0.1 mM MEM nonessential amino acid (Cellgro), 0.1 mM 2-mercaptoethanol (Sigma Aldrich, Germany) and 1000 U/mL LIF (Millipore), which are added to the medium to prevent differentiation.

Mouse ES cells were seeded in 96-well plates containing the above various cryopreservation liquids at a density of $8\times10^4$ cells per well. After 9 hours, CCK-8 reagent was added and a fluorescence intensity was measured using an ELISA Reader (TECAN). 250 μL of trypsinized 293T solution, 200 μL of FBS and 50 μL of cryopreservation liquid (0 μg/ml, 50 μg/ml, 100 μg/ml, 200 μg/ml, 400 μg/ml) were frozen in a quick freezer for 2 days, then stored in an LN2 tank. Thawing was performed in a water bath at 37° C. A mixture of the frozen cell stocks was inoculated into 4.5 mL medium in a 15 mL tube, and centrifuged at 1000 rpm for 5 minutes. 1 mL medium was added to cell pellets and inoculated into a 6-well plate. The mouse ES cells were cultured in 2.5 μM to 10 μM cryopreservation liquid for 12 hours. Cells were washed with 500 μL of PBS, and 500 μL of 4% PFA was added for 15 minutes. The fixed cells were washed twice with 500 μL of PBS, and 0.5% crystal violet solution was added for 30 minutes. Dyed cells were washed with tap water. DMSO, which is a currently widely used cryoprotectant, was used as a control.

Figure 6:
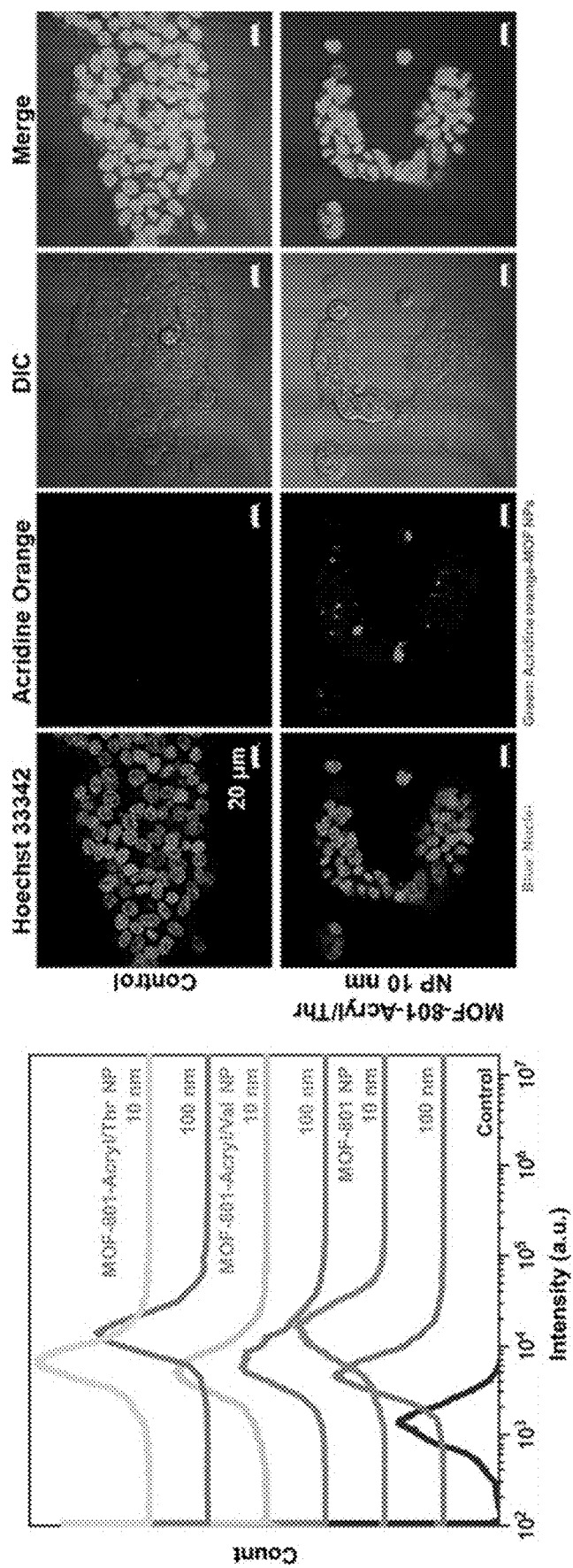
FIG. 6 is a flow cytometric analysis histogram (left) and CLSM image (right) confirming the cell internalization of MOF-801 NP to 293T cells.

FIG. 6 is a confocal laser scanning microscopy (CLSM) image which confirms cell internalization of 293T cells, flow cytometry histograms on the left, and intracellular distribution of MOF-801 NPs on 293T cells on the right. It was confirmed that MOF-8010 NP is cell-penetrating cryopreservative penetrating into the cell.

Figure 7A:
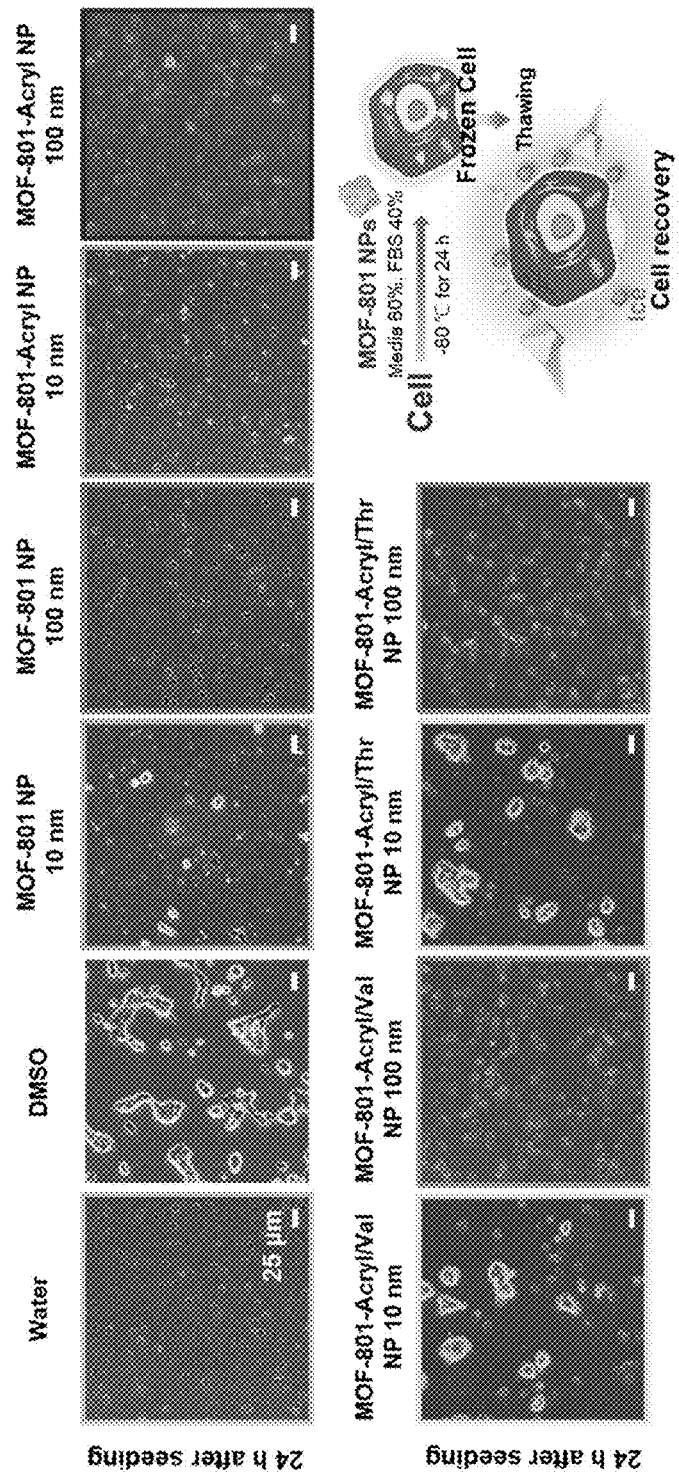
Figure 7B:
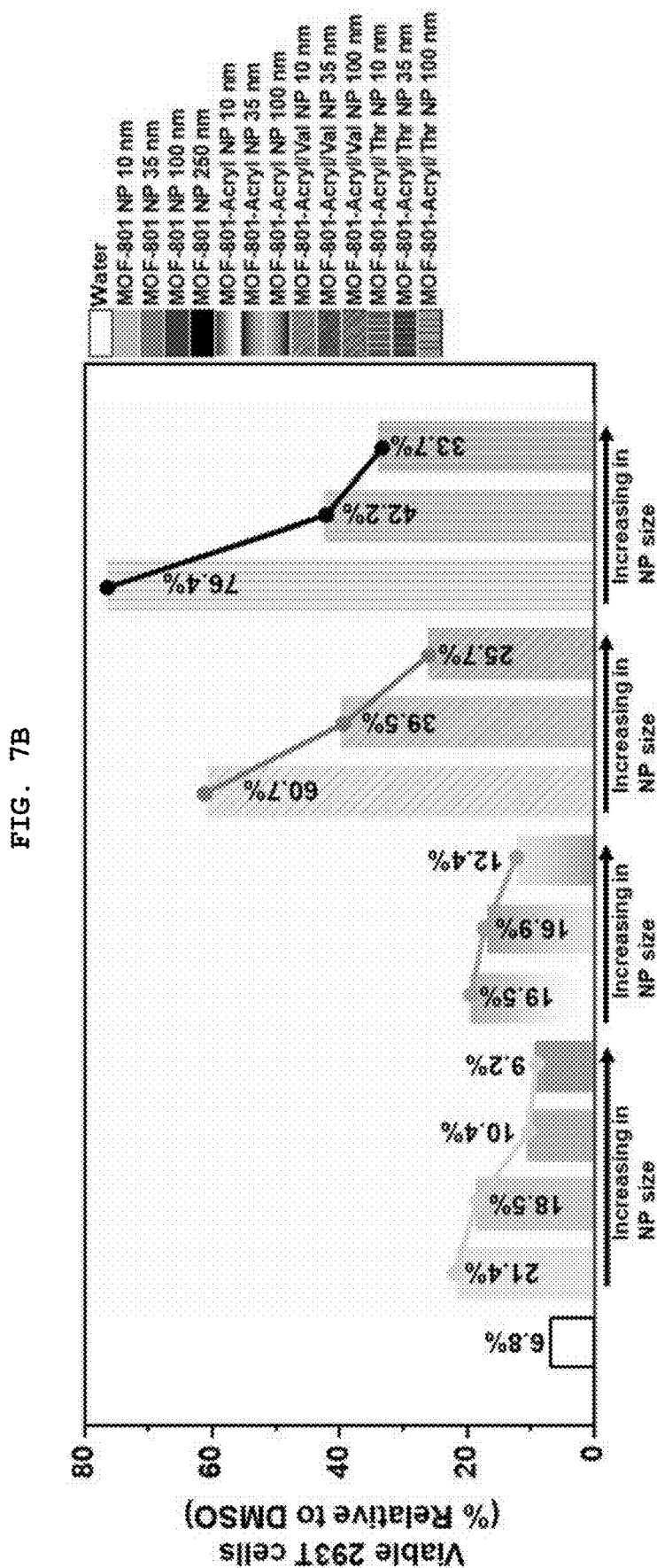
Figure 8:
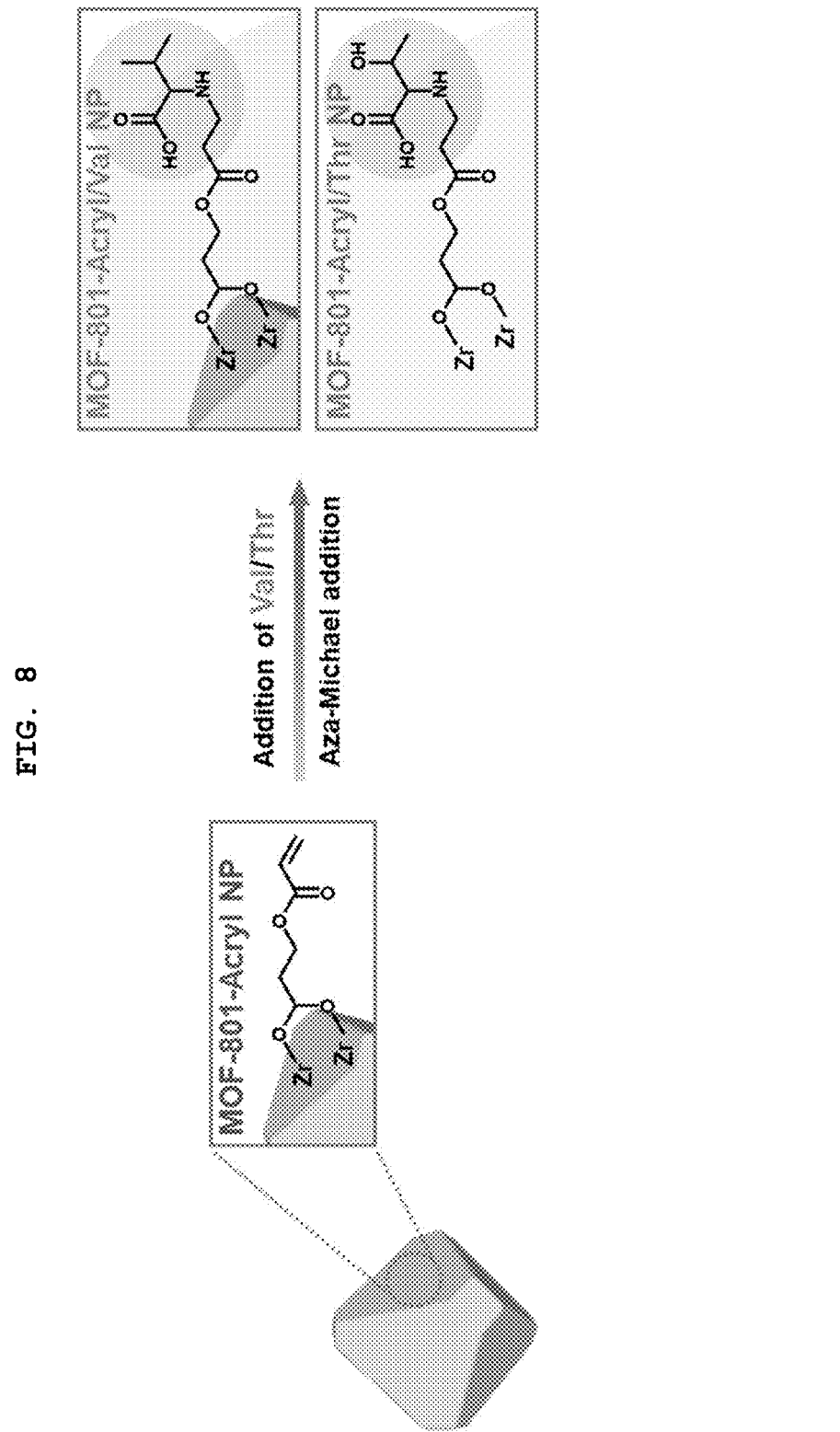
FIG. 8 schematically illustrates amino acid bond to MOF-Acryl.

For both MOF and MOF-Acryl, it was confirmed that the cryopreservation effect of cells was increased as the particle size is decreased, and MOF having a particle size of 35 nm or less exhibited a higher cryopreservation effect than DMSO (FIGS. 7A and 7B).

The smaller the size of the MOF-801 NP, the higher the microcurvature was formed at an ice-water interface, and when the surface thereof was modified with amino acids, it was possible to push out water molecules due to hydrophobic interaction, and thereby higher cryopreservation efficiency could be exhibited than bare MOF-801 NP.

5. FT-IR and XPS Analysis of MOF Particles

FT-IR analysis was performed to confirm whether the surface of the MOF-801 particles was subjected to acrylate functionalization and whether amino acids were bound thereto. Using a zinc selenide (ZnSe) window, 10 μL of a sample at a concentration of 1.0 mg/ml was dropped per test and dried at room temperature. The analysis was performed in a vacuum state using a Vertex 70v spectrometer (Bruker, Germany).

Figure 9:
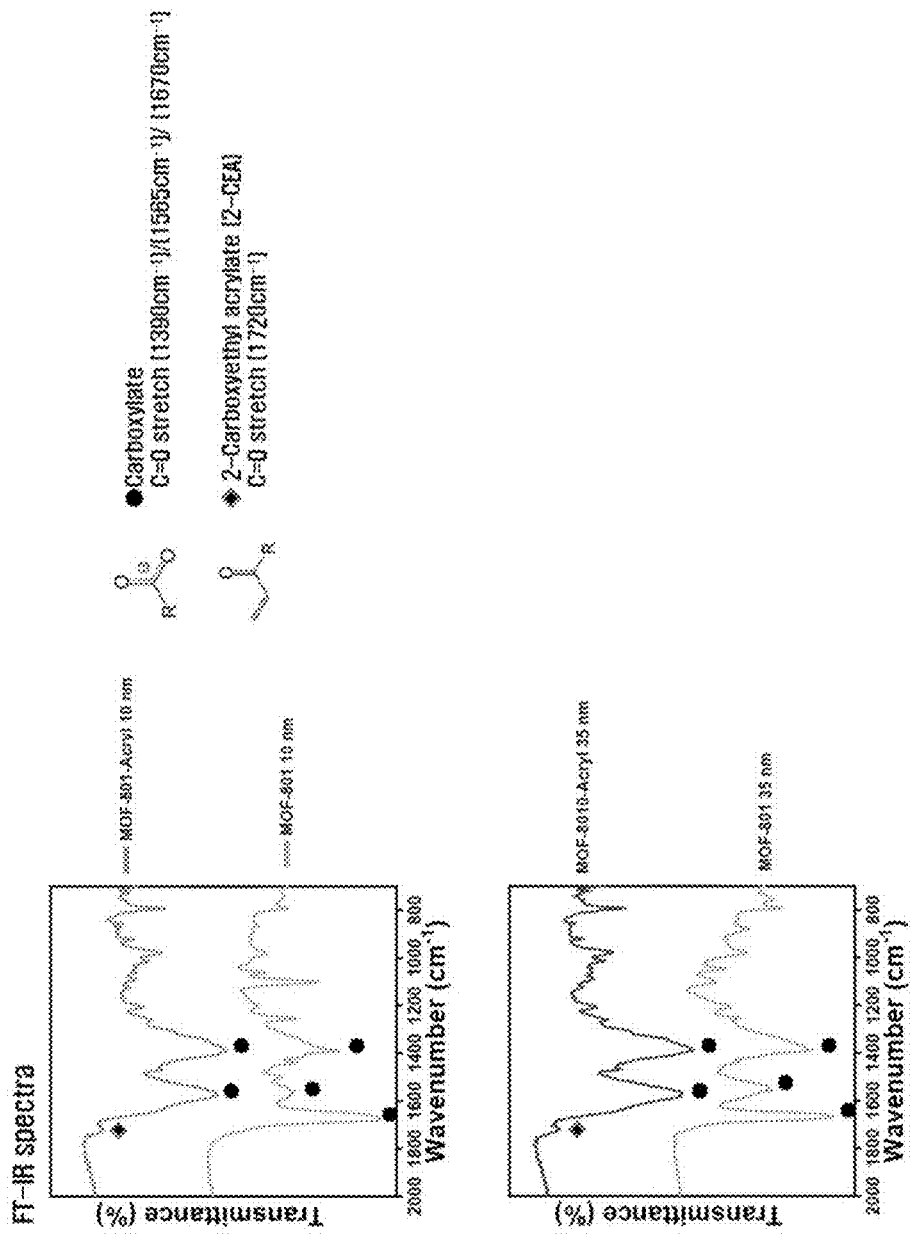
FIG. 9 illustrates results of FT-IR analysis for MOF-Acryl.

Through FT-IR analysis, it was confirmed that the amino acids were bound to the conventional MOF subjected to acrylate functionalization (FIG. 9) and MOF-Acryl (FIG. 10A).

Figure 10B:
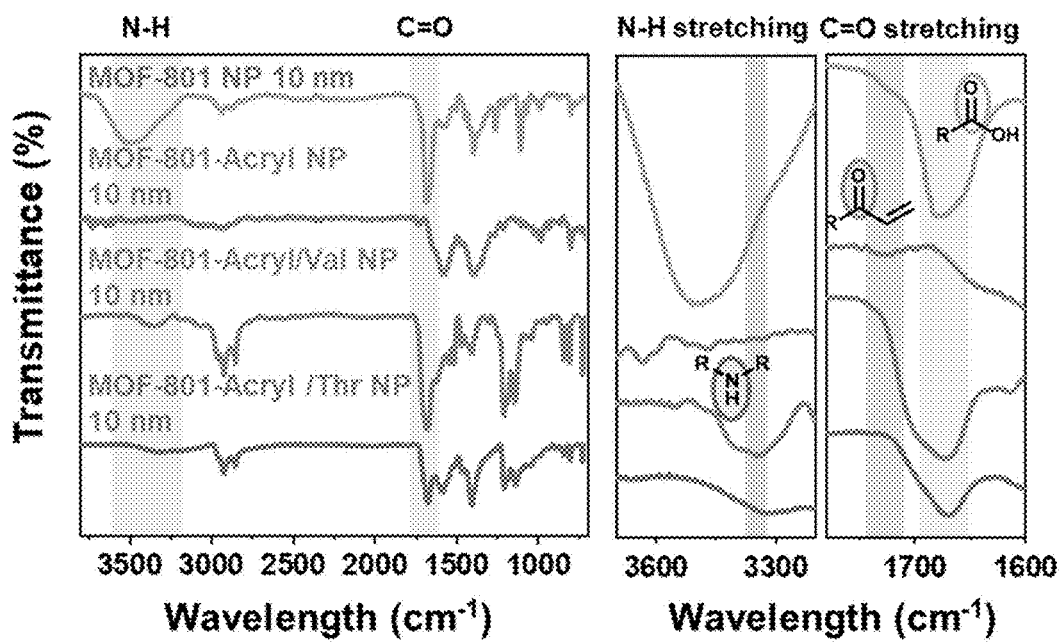

FIG. 10B illustrates results of confirming the sequential completion of the MOF-801 NP 10 nm surface modification reaction by FT-IR spectroscopy. Compared with MOF-801 NP 10 nm, which shows C=O stretching peak of the carboxyl group at 1675 $cm^{-1}$, the C=O stretching peak of the carboxyl group in MOF-801-Acryl NP was weakened and C=O stretching peak of α,β-unsaturated esters disappeared at 1720 $cm^{-1}$. In MOF-801-Acryl/Val and/Thr NPs, the C=O stretching peaks of α,β-unsaturated esters appeared, and the C=O stretching peaks derived from the C terminal of amino acids appeared at 1670 $cm^{-1}$ and 1705 $cm^{-1}$. In addition, in MOF-801-Acryl/Val NP and /Thr NP, N—H stretching peaks of secondary amines derived from the combination of acrylate and amino acid were observed at 3320 and 3335 $cm^{-1}$, respectively.

TEM images show that the size of MOF NPs was maintained similar to that of bare MOF-801 NP even after surface functionalization. Similarly, as confirmed by FT-IR spectroscopy, Val and Thr were successfully introduced into MOF-801-Acryl NPs 35 nm and 100 nm, respectively. In FIG. 10C, sequential completion of the surface modification reaction was equally confirmed by FT-IR spectroscopy for each of MOF-801 NP 35 nm and MOF-801 NP 100 nm.

Figure 11:
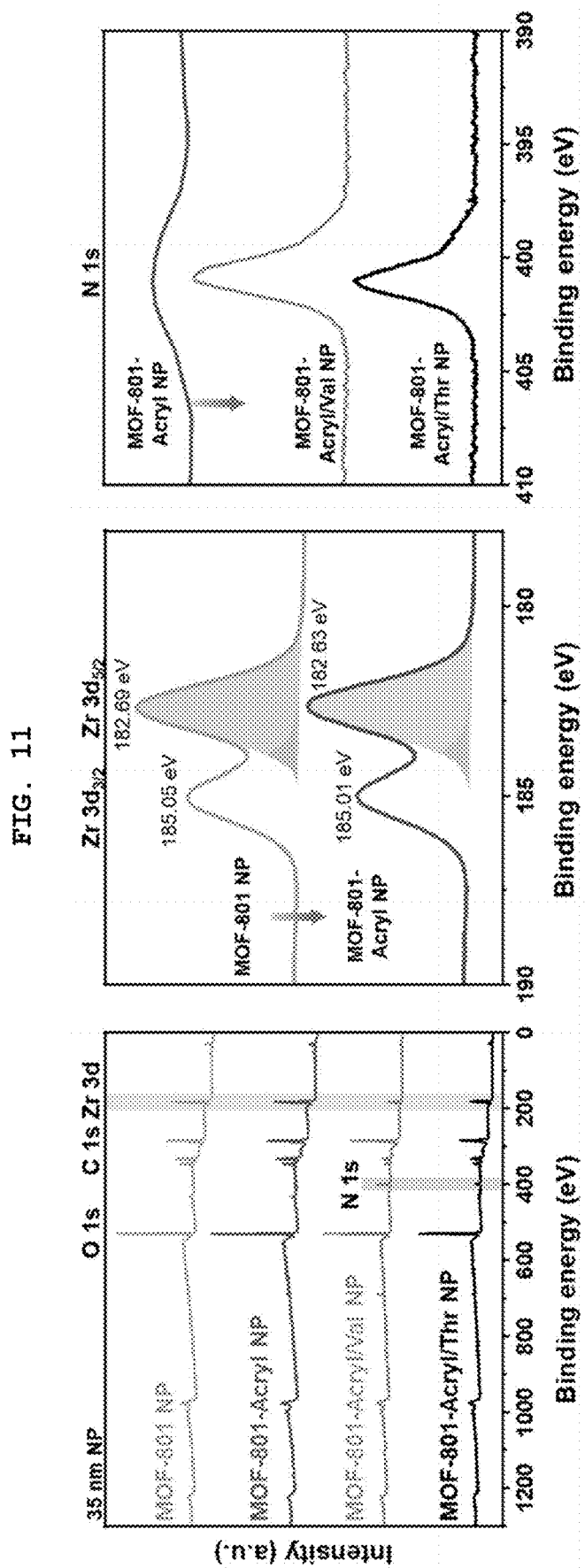
FIG. 11 illustrates X-ray photoelectron spectroscopy (XPS) spectra of MOF, MOF-Acryl, MOF-Acryl/Val and MOF-Acryl/Thr.

In addition, X-ray photoelectron spectroscopy (XPS) was performed on MOF-801 NP, MOF-801-Acryl NP, MOF-801-Acryl/Val NP and MOF-801-Acryl/Thr NP. The XPS spectra of FIG. 11 suggest the presence of Zr, C and O in MOF-801 NP and MOF-801-Acryl NP 35 nm, and as compared with MOF-801 NP of the same size in the MOF-801-Acryl NP 35 nm spectrum, acrylate functionalization was verified due to the relative shift of the Zr 3d peak.

The nearly identical positions of Zr $3d_{3/2}$ and $3d_{5/2}$ in both samples mean that the acrylate group was bound to the surface of the MOF NPs through a covalent bond rather than the coordination bond. In addition, the introduction of amino acids was further confirmed by the appearance of N is peaks in the spectra of MOF-801-Acryl/Val and/Thr NPs 35 nm.

6. IRI Effect of MOF-Acryl/Amino Acid

MOF-Acryl/Thr and MOF-Acryl/Val were prepared by binding Thr and Val, which are known to bind well to ice crystals, to the above-described MOF-Acryl, respectively. Specifically, the above-described MOF-801-Acrylate and amino acid molecules were put in a solvent and stirred at room temperature for 24 hours, thereby amino acid bond therebetween could be executed through the Aza-Michael addition reaction. The solvent is not particularly limited as long as it is a solvent that allows MOF and amino acid to be easily dissolved, such as EtOH, DMF, or THF, etc., and the reaction may be performed even under solvent-free conditions.

In the case of this experiment, the reaction was performed by employing THF as a solvent. MOF-801 and the prepared L-Threonine or L-Valine of HPLC-grade (Sigma Aldrich, Germany) were dissolved in THF in a glass vial having a size of 4 mL, followed by stirring at room temperature for 24 hours.

By binding amino acids as described above, it is possible to obtain MOF particles having higher biocompatibility and increased chemical adsorption capacity for ice crystals.

Figure 13:
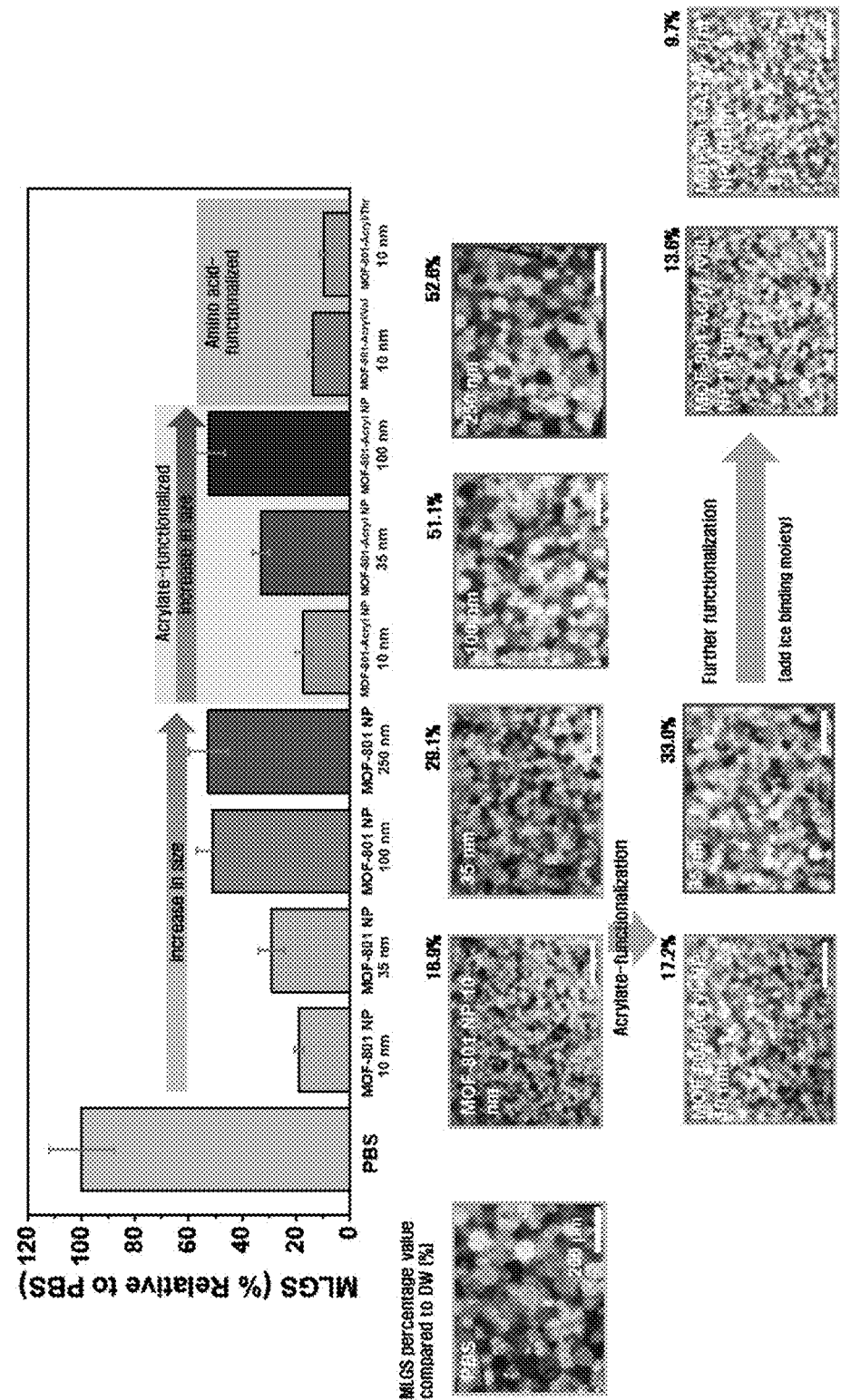
FIG. 13 illustrates the IRI inhibitory effects of MOF, MOF-Acryl, MOF-Acryl/Val and MOF-Acryl/Thr together.

The IRI effect of MOF-Acryl bound with amino acid is shown in FIGS. 12A-12B and 13, and from these drawings, it can be confirmed that the MLGSs of both MOFs bound with Thr and Val were significantly reduced at 10 nm compared to PBS. The degree of IRI activation of MOF-Acryl/Thr and MOF-Acryl/Val is not significantly different from the degree of IRI activation of MOF-801 and MOF-Acryl having a size of 10 nm, but by introducing amino acids, which are biomolecules, into the known conventional MOF-801, biocompatibility may be increased and a direct hydrogen bond with water molecules may be induced.

FIG. 13 illustrates that the smaller the size of the MOF-801 NPs, the higher the microcurvature was formed at the ice-water interface, thereby exhibiting the higher IRI effect. In addition, when the surface thereof was modified with amino acids, it was possible to push out water molecules due to hydrophobic interaction, such that the higher IRI effect could exhibit than bare MOF-801 NP.

What is claimed is:

1. A composition comprising:
   particles of metal-organic framework (MOF), each particle comprising central metals of zirconium and linkers which are organic ligands for connecting the central metals,
   wherein at least two adjacent zirconiums on a surface of the particle have a structure represented by Formula 1:

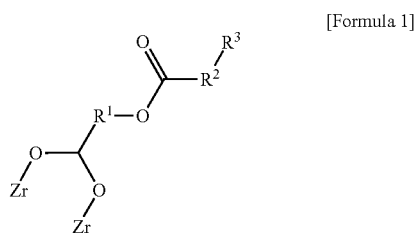

[Formula 1]

wherein Zr is the zirconium on the surface of the particle; $R^1$ and $R^2$ are each alkyl having 1 to 5 carbon atoms; and $R^3$ is one selected from the group consisting of Thr, Val, Ala, Ser and Gly,
wherein an amino group ($-NH_2$) of $R^3$ is bound to the alkyl of $R^2$.

2. The composition of claim 1, wherein the particle has a size of 35 nm or less.

3. The composition of claim 1, wherein the metal-organic framework includes fumarate as an organic ligand.

4. A method for inhibiting ice crystal formation or growth in a subject to be cryopreserved, the method comprising applying the composition of claim 1 to a subject where an ice crystal is to be formed or to grow,
   wherein the subject is at least one of a cell, a tissue, and/or food to be cryopreserved.

5. The method of claim 4, wherein the subject is at least one of the cell or the tissue to be cryopreserved.

6. The method of claim 4, wherein the subject is the food to be cryopreserved.

* * * * *